United States Patent
Miyata

(10) Patent No.: US 12,292,602 B2
(45) Date of Patent: May 6, 2025

(54) LIGHT SOURCE DEVICE

(71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 303 days.

(21) Appl. No.: 17/878,597

(22) Filed: Aug. 1, 2022

(65) Prior Publication Data

US 2023/0035957 A1    Feb. 2, 2023

(30) Foreign Application Priority Data

Aug. 2, 2021  (JP) ................... 2021-126644
Jan. 28, 2022  (JP) ................... 2022-011845

(51) Int. Cl.

| G02B 6/42 | (2006.01) |
|---|---|
| H01S 5/02253 | (2021.01) |
| H01S 5/024 | (2006.01) |
| H01S 5/42 | (2006.01) |
| H01S 5/323 | (2006.01) |

(52) U.S. Cl.
CPC ............ *G02B 6/42* (2013.01); *G02B 6/4201* (2013.01); *G02B 6/4214* (2013.01); *H01S 5/02253* (2021.01); *H01S 5/02469* (2013.01); *H01S 5/423* (2013.01); *H01S 5/32325* (2013.01)

(58) Field of Classification Search
CPC ... G02B 6/0085; G02B 6/4268; G02B 6/4201
See application file for complete search history.

(56) References Cited

U.S. PATENT DOCUMENTS

| 2003/0026303 A1* | 2/2003 | Ouchi | .................... H01S 5/423 372/50.1 |
| 2003/0165305 A1* | 9/2003 | Dallas | .................. G02B 6/4251 156/325 |
| 2004/0101008 A1* | 5/2004 | Kurtz | ................... H04N 9/3161 372/39 |

(Continued)

FOREIGN PATENT DOCUMENTS

| JP | 2004117730 A | * | 4/2004 |
| JP | 2005017648 A | * | 1/2005 |

(Continued)

OTHER PUBLICATIONS

WO 2012023430 A1 English translation (Year: 2012).*
JP-2005017648-A English translation (Year: 2005).*

*Primary Examiner* — Charlie Y Peng
(74) *Attorney, Agent, or Firm* — Foley & Lardner LLP

(57) ABSTRACT

A light source device includes: a substrate having a support face; a plurality of light emitting elements disposed on the support face, the plurality of light emitting elements including a first light emitting element and a second light emitting element, each of which is a vertical-cavity surface-emitting laser element; and a planar lightwave circuit having a light incident face that faces the support face and including a plurality of optical waveguides configured to guide light that has exited from the respective plurality of light emitting elements and entered the light incident face. The planar lightwave circuit is directly or indirectly supported by the plurality of light emitting elements. The substrate includes a first wiring layer electrically connected to the first light emitting element and the second light emitting element.

20 Claims, 12 Drawing Sheets

(56) References Cited

U.S. PATENT DOCUMENTS

| | | | |
|---|---|---|---|
| 2004/0264884 A1* | 12/2004 | Liu | G02B 6/4292 |
| | | | 385/89 |
| 2011/0026878 A1 | 2/2011 | Matsuoka et al. | |
| 2013/0121354 A1 | 5/2013 | Takaki et al. | |
| 2015/0153522 A1 | 6/2015 | Nakagawa et al. | |
| 2015/0205062 A1* | 7/2015 | Collins | G02B 6/34 |
| | | | 385/14 |
| 2016/0226223 A1* | 8/2016 | Tan | H01S 5/04256 |

FOREIGN PATENT DOCUMENTS

| | | |
|---|---|---|
| JP | 2006-011046 A | 1/2006 |
| JP | 2009-192678 A | 8/2009 |
| JP | 2010-191123 A | 9/2010 |
| JP | 2011-028111 A | 2/2011 |
| JP | 2012-019157 A | 1/2012 |
| JP | 2015-106006 A | 6/2015 |
| WO | WO-2012/023430 A1 | 2/2012 |

* cited by examiner

LIGHT SOURCE DEVICE

CROSS-REFERENCE TO RELATED APPLICATION

This application claims priority to Japanese Patent Application No. 2021-126644, filed on Aug. 2, 2021, and Japanese Patent Application No. 2022-011845, filed on Jan. 28, 2022, the disclosures of which are hereby incorporated by reference in their entireties.

BACKGROUND

The present disclosure relates to a light source device.

Optical modules equipped with vertical-cavity surface-emitting laser elements have been developed in various application areas. Japanese Patent Publication No. 2015-106006 discloses an optical module capable of inputting and outputting wavelength multiplexed optical signals to and from an optical waveguide for use in optical communication. The optical module includes a plurality of vertical-cavity surface-emitting laser elements arranged on the optical waveguide.

SUMMARY

Certain embodiments of the present disclosure provide light source devices having good heat dissipation properties.

According to one embodiment of the disclosure, a light source device includes a substrate having a support face, a plurality of light emitting elements, and a planar lightwave circuit. The light emitting elements disposed on the support face include a first light emitting element and a second light emitting element. The first light emitting element and the second light emitting element are each a vertical-cavity surface-emitting laser element. The planar lightwave circuit has a light incident face that faces the support face and a plurality of optical waveguides that allow light exiting from the light emitting elements to enter the light incident face to be respectively waveguided. The planar lightwave circuit is directly or indirectly supported by the plurality of light emitting elements. The substrate includes a first wiring layer electrically connected to the first light emitting element and the second light emitting element.

According to an embodiment of the present disclosure, a light source device with good heat dissipation properties can be provided.

DETAILED DESCRIPTION

Figure 1:
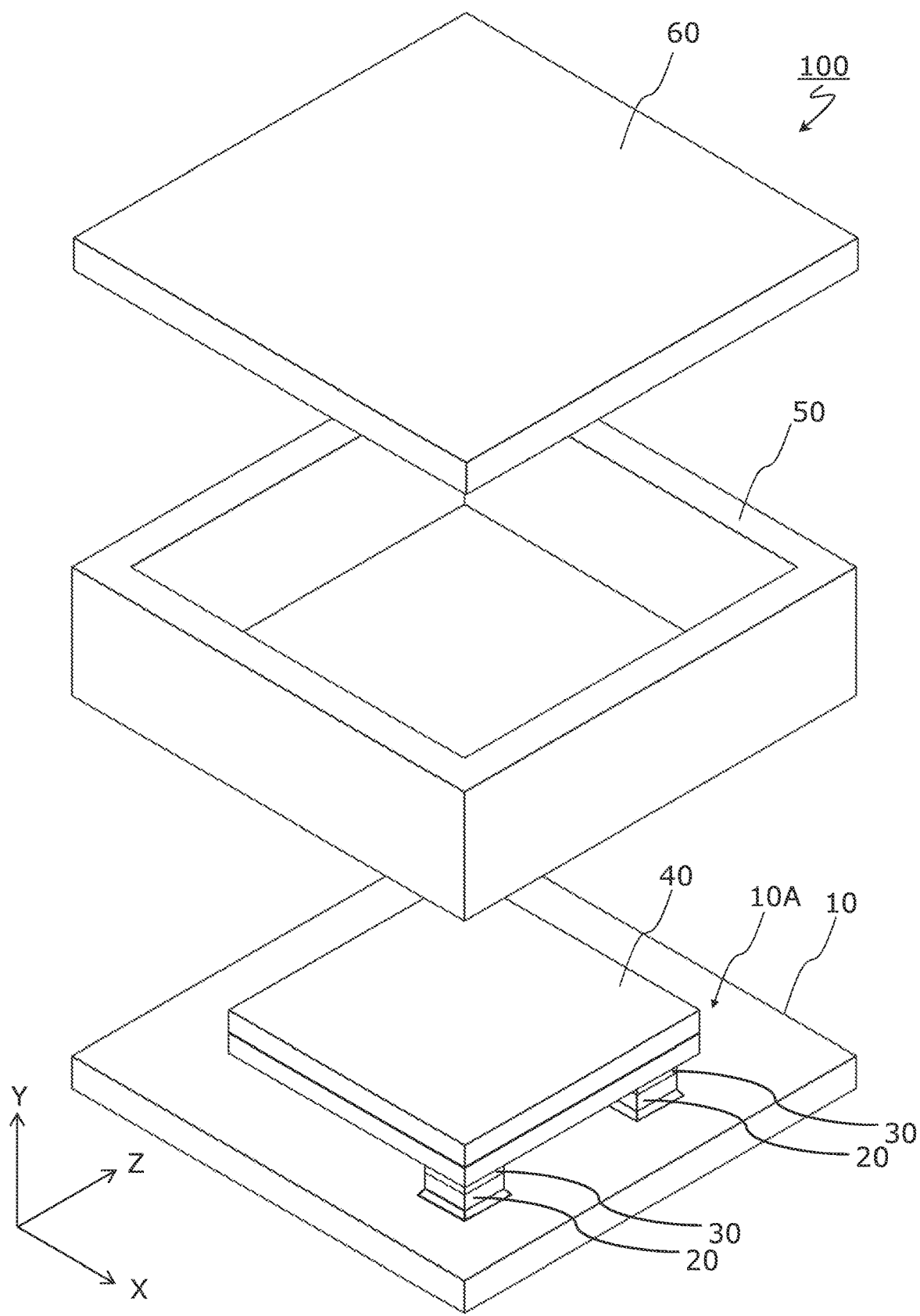
FIG. 1 is an exploded view of a light source device according to an exemplary embodiment of the present disclosure.

Certain embodiments of the present disclosure will be explained in detail below with reference to the accompanying drawings. The embodiments described below are exemplary, and the light source devices according to the present disclosure are not limited to those described below. For example, the numerical values, shapes, materials, manufacturing steps, and the sequence of the steps described in the embodiments below are merely examples, and are modifiable in various ways to the extent that such a modification does not cause technical inconsistencies. The various forms described below are merely exemplary, and various combinations can be made to the extent that such a combination does not cause technical inconsistencies.

The dimensions, shapes and the like of the constituent elements shown in the drawings may be exaggerated for clarity of explanation, and may not reflect the dimensions and shapes of, and the relative sizes among the constituent elements in an actual light source device. Certain elements may be omitted in a drawing so as not to make the drawing excessively complex.

In the description below, the constituent elements having practically the same functions are denoted by common reference numerals for which explanation may be omitted. Terms indicating specific directions or positions (e.g., "upper," "lower," "right," "left" and other terms including or related to these) may be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing equipment outside of the present disclosure, does not have to be the same as those shown in the referenced drawing.

In the description or the accompanying claims, a polygon, such as a triangle, rectangle, or the like, is not limited to those in the strict mathematical sense, and includes a shape subjected to processing, such as cutting angles, chamfering, beveling, rounding, or the like. Moreover, the location of such processing is not limit to a corner (an end of a side) of a polygon. Rather, a shape subjected to processing in the intermediate portion of a side will similarly be referred to as a polygon. In other words, any polygon-based shape subjected to partially processing should be understood to be included in the interpretation of a "polygon."

In the description or the accompanying claims, moreover, when there are multiple pieces of a certain component and a distinction must be made, a word such as "first," "second," or the like might occasionally be added. These words are merely labels added to distinguish the subjects, and do not have any particular meaning as to the numbers, the order or the sequence of the subjects. For example, if claim 1 in the scope of claims includes the term "first light emitting element," but not the term "second light emitting element," the invention of claim 1 can simply include one light emitting element, and the light emitting element is not limited to the "first light emitting element" in the description, but rather can be the "second light emitting element" in the description.

Figure 2:
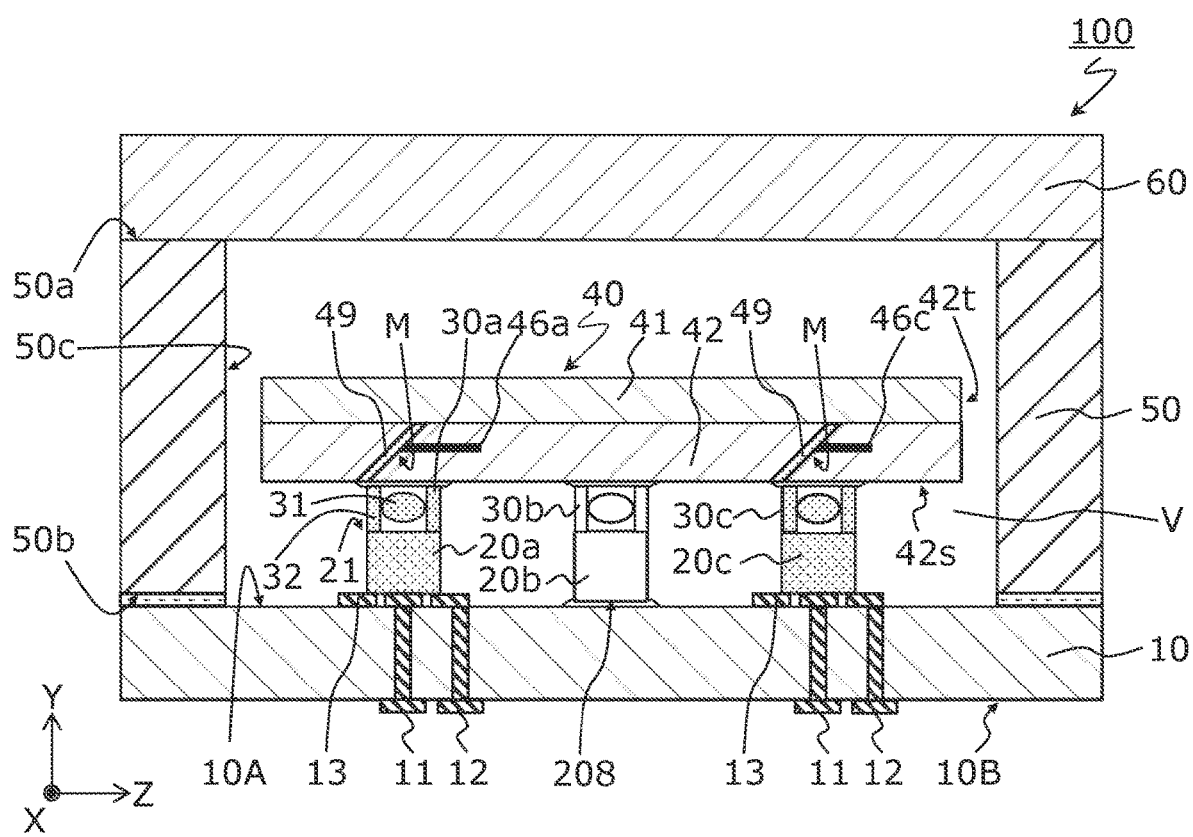
FIG. 2 is a cross-sectional view in the Y-Z plane of a light source device according to the exemplary embodiment of the present disclosure.

An exemplary structure of a light source device 100 according to an embodiment will be explained with reference to FIG. 1 and FIG. 2. In the accompanying drawings, arrows indicating the x, y, and z axes that are orthogonal to one another are provided. FIG. 1 is an exploded view of the light source device 100. FIG. 2 is a cross-sectional view in the YZ plane of the light source device 100.

The light source device 100 according to this embodiment includes a substrate 10, a plurality of light emitting elements 20, a plurality of optical members 30, a planar lightwave circuit 40, a lateral wall part 50, and a lid member 60. As described below, the optical members 30 are not essential. The light source device 100 may include a submount. Furthermore, in accordance with the product specifications or required specifications, the light source device 100 can include a protective device represented by a Zener diode and/or a temperature sensor such as a thermistor for measuring the internal temperatures. Furthermore, the light source device 100 can include a light receiving element such as a photodiode for monitoring the intensity of the laser light exiting from the light emitting elements 20.

The light source device 100 illustrated in FIG. 1 and FIG. 2 includes three light emitting elements 20. The three light emitting elements 20, which include a first light emitting element 20a, a second light emitting element 20b, and a third light emitting element 20c, can emit light of different peak wavelengths from one another selected from among blue, green, red, and infrared. At least two of the three light emitting elements 20 may emit light of the same peak wavelength. The three light emitting elements 20 in the present embodiment emit light of different peak wavelengths from one another selected from among blue, red, and green. The number of light emitting elements is not limited to three, and can be two or more.

The light emitted from the light emitting elements 20 in the direction normal to the support face 10A of the support 10 enters the planar lightwave circuit 40, propagates through the optical waveguides provided in the planar lightwave circuit 40, and exits in the direction in parallel with the support face 10A (+Z direction). The light laterally exiting the planar lightwave circuit 40 is output through the light transmissive portion of the lateral wall part 50 that has light transmissivity at least in one portion. The light emitting elements 20 in the present embodiment are vertical-cavity surface-emitting laser elements. Combining a plurality of vertical-cavity surface-emitting laser elements with a planar lightwave circuit can make the distances between the centers of the emission points when the light exits the planar lightwave circuit smaller than the distances between the centers of the emission points of the vertical-cavity surface-emitting laser elements. This can position the emission points near the optical axis 81 of a lens 80 (see FIG. 6). As a result, a light source device having good light collecting characteristics can be provided.

As illustrated in FIG. 1, in the direction normal to the support face 10A of the substrate 10, the light source device 100 is quadrangular. However, the shape of the light source device is not limited to this. In FIG. 1 and FIG. 2, the direction normal to the support face 10A coincides with the Y direction. In the explanation below, "when viewed from above" means viewing a subject in the direction normal to the support face 10A from the +Y side. For example, the size of the light source device 100 in the X direction is about 1.0 mm to about 30.0 mm, and the size in the Z direction is about 1.0 mm to about 30.0 mm. The thickness of the light source device 100 in the Y direction can be about 1.0 mm to about 6.0 mm.

Substrate 10

The substrate 10 in this embodiment is a sheet-shaped member. The substrate 10 has a support face 10A that directly or indirectly supports light emitting elements 20 and a lower face 10B positioned opposite the support face 10A. On the support face 10A of the substrate 10, a metal film such as gold can be formed for bonding other components, such as a light emitting element 20 and a lateral wall part 50. The substrate 10 can be formed by using a ceramic, metal, glass, silicon, or resin as a main material. The substrate 10 directly or indirectly supports a light emitting element 20, and can dissipate the heat generated by the light emitting element 20. In order to improve the heat dissipation properties, the substrate 10 is preferably formed with a highly heat conductive material, such as MN or a metal.

The substrate 10 has a conductor wiring layer and external connection electrodes electrically connected to a light emitting element 20. The conductor wiring layer and the external connection electrodes can be formed by using a metal material, such as tungsten, molybdenum, nickel, gold, silver, platinum, titanium, copper, aluminum, ruthenium, and the like.

The substrate 10 in this embodiment has a conductor wiring layer that includes a first wiring layer 13 electrically connected to the three light emitting elements 20. The conductor wiring layer can be disposed on the support face 10A of the substrate 10 and within the substrate 10, and the external connection electrodes 11 and external connection electrodes 12 on the lower face 10B of the substrate 10. The first wiring layer 13 disposed on the support face 10A is electrically connected to the external connection electrodes 11 and the external connection electrodes 12 disposed on the lower face 10B via the conductor wiring layer disposed within the substrate 10.

The external connection electrode 11 is electrically connected to one of the p-side electrode face and the n-side electrode face of a light emitting element 20. The external connection electrode 12 is electrically connected to the other of the p-side electrode face and the n-side electrode face of the light emitting element 20. For example, an external power supply or external drive circuit for driving the light emitting elements 20 can be electrically connected to the light emitting elements 20 via the external connection electrodes 11 and the external connection electrodes 12. The external connection electrodes 11 and the external connection electrodes 12 do not need to be disposed on the lower face 10B as illustrated in FIG. 2. For example, by making the size of the substrate 10 larger than the outline of the lateral wall part 50 when viewed from above, the external connection electrode 11 and the external connection electrodes 12 can be disposed in the region of the support face 10A located outward of the outline of the lateral wall part 50.

In the light source device 100 illustrated in FIG. 2, the first wiring layer 13 that is connected to the external connection electrode 12 can be disposed on the support face 10A to partially or entirely surround the first wiring layer 13 that is connected to the external connection electrodes 11. Because such a layout can increase the bonding areas between the first wiring layer 13 and the p-side and the n-side electrode faces of a light emitting element 20, the heat dissipation properties and the bonding strength can be enhanced. Examples of the pattern of the first wiring layer 13 will be described in detail below.

The size of the substrate 10 illustrated in FIG. 1 in the X direction and the Z direction is, for example, about 0.5 mm to about 30.0 mm each, and the thickness in the Y direction is, for example, about 0.2 mm to about 1.0 mm. The size of the lateral wall part 50 in the X direction and the Z direction is similar to that of the substrate 10, and the thickness in the Y direction is, for example, about 0.9 mm to about 3.8 mm.

Light Emitting Element 20

The light emitting elements 20 in this embodiment are vertical-cavity surface-emitting laser (VCSEL) elements. Hereinafter, vertical-cavity surface-emitting laser elements will be referred to as VCSEL elements. A VCSEL element is superior to an edge-emitting laser such that it can achieve a more circular beam shape, and can be driven with less power. The light source device 100 may include edge-emitting laser elements or LEDs (light emitting diodes) in place of the VCSEL elements. The "light emitting elements" in the present disclosure can be any that can emit light in the +Y direction, encompassing these laser elements and LEDs in addition to VCSEL elements.

An exemplary structure of a light emitting element will be explained with reference to FIG. 3A and FIG. 3B. However, the structure described below is merely an example, and the structure of the light emitting elements 20 in this embodiment is not limited to this.

Figure 3A:
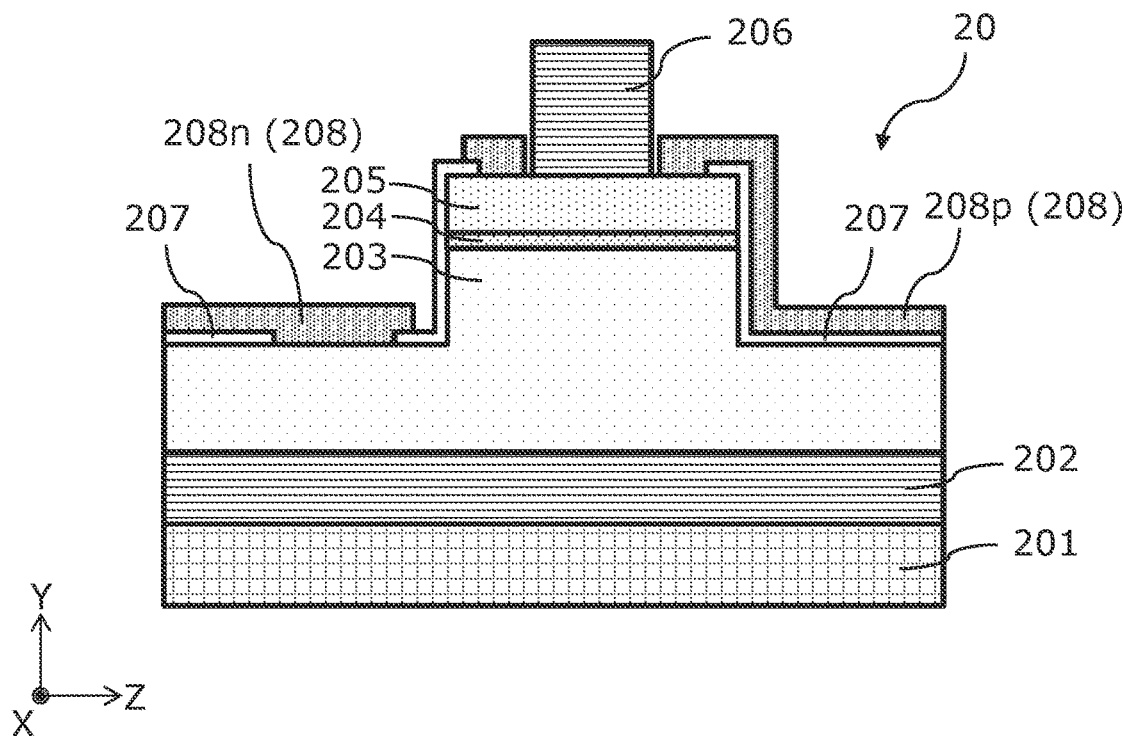
FIG. 3A is a cross-sectional view in the Y-Z plane schematically showing an example of the structure of a vertical-cavity surface-emitting laser element.

FIG. 3A is a cross-sectional view in the YZ plane schematically showing the structure of a light emitting element. FIG. 3B is a top view of the structure shown in FIG. 3A. The light emitting element 20 illustrated in the drawings has a stack structure in which a semiconductor substrate 201, an n-side reflective film 202, an n-type semiconductor layer 203, an active layer 204, a p-type semiconductor layer 205, and a p-side reflective film 206 are stacked in that order. The relationship between the p-type and n-type conductivity types may be reversed. The semiconductor substrate 201 may be removed.

The n-type semiconductor layer 203 has a flat sheet portion and a projected portion projecting in the +Y direction therefrom. The active layer 204 is disposed in the region of the upper face of the projected portion of the n-type semiconductor layer 203, and the p-type semiconductor layer 205 is disposed on the upper face of the active layer 204. The p-type reflective layer 206 is disposed on the upper face of the p-type semiconductor layer 205 excluding the peripheral region. The light emitting element 20 includes an insulation layer 207 covering the upper face of the flat sheet portion and the lateral faces of the projected portion of the n-type semiconductor layer 203. However, a portion of the upper face of the flat sheet portion of the n-type semiconductor layer 203 is not covered by the insulation layer 207, but is exposed. The light emitting element 20 includes a p-side electrode 208p electrically connected to the p-type semiconductor layer 205 and an n-side electrode 208n electrically connected to the exposed portion of the n-type semiconductor layer 203.

Figure 3B:
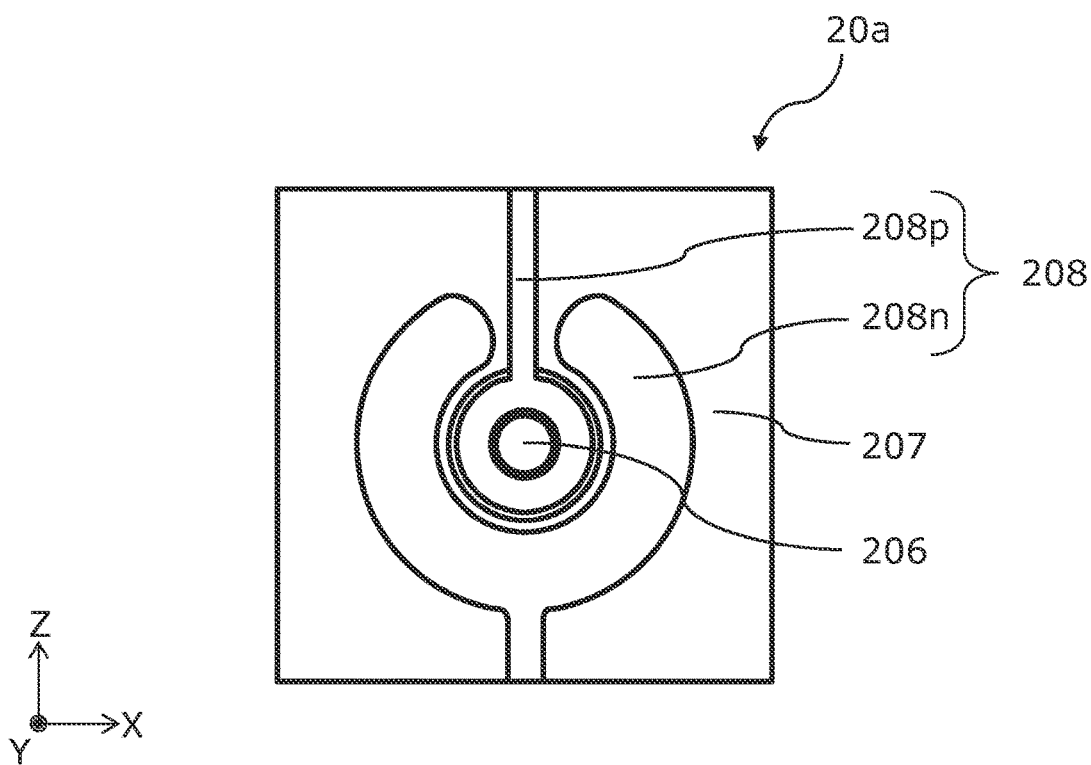
FIG. 3B is a top view of the structure shown in FIG. 3A.

As illustrated in FIG. 3B, when viewed from above, the p-side reflective film 206, the insulation layer 207, the p-side electrode 208p, and the n-side electrode 208n are exposed. When viewed from above, the p-side electrode 208p includes a ring shaped portion surrounding the p-side reflective film 206, and a straight line portion extending from the ring shaped portion in the +Z direction. The n-side electrode 208n when viewed from above includes a C shaped portion that surrounds the ring shaped portion of the p-side electrode 208p and the p-side reflective film 206 and a straight line portion extending from the C shaped portion in the −Z direction. The p-side electrode 208p and the n-side electrode 208n make up an electrode pair 208. However, the stack structure is not limited to that shown in the drawing, and the n-side electrode 208n can simply be disposed to oppose the p-side 208p in relation to the active layer 204.

The n-side reflective film 202 and the p-side reflective film 206 may each be formed, for example, from a distributed Bragg reflector (DBR).

As illustrated in FIG. 3B, the outline of the light emitting element 20 when viewed from above is substantially square shaped, but is not limited to this. The shape can be, for example, a rectangle or another polygon, or a circle. The size of the light emitting element 20 in the XZ plane can differ depending on the number of emitters. The size in the X direction and the Z direction is, for example, about 0.15 mm to about 2.0 mm each, and the size (thickness) in the Y direction is, for example, about 0.02 mm to about 0.2 mm.

A red light emitting VCSEL element can be formed, for example, from at least one semiconductor material selected from the group consisting of InAlGaP, GaInP, GaAs, and AlGaAs. As an example of such a VCSEL element, the semiconductor substrate 201 can be formed from n-type GaAs, the stack structures of the n-side reflective film 202 and the p-side reflective film 206 can be formed from n-type and p-type AlGaAs of different compositional ratios, respectively. The n-type semiconductor layer 203 and the p-type semiconductor layer 205 can be formed from n-type and p-type AlGaInP, respectively, and the active layer 204 can be formed from GaInP.

A green or blue light emitting VCSEL element can be formed, for example, from at least one semiconductor material selected from the group consisting of GaN, InGaN, and AlGaN. As an example of such a VCSEL element, the semiconductor substrate 201 can be formed from GaN. The stack structure of the n-side reflective film 202 can be formed from AlInN and GaN, and the stack structure of the p-side reflective film 206 can be formed from dielectric materials, such as $SiO_2$, $Nb_2O_5$, and the like. The n-type semiconductor layer 203 and the p-type semiconductor layer 205 can be formed from n-type and p-type GaN, respectively, and the active layer 204 can be formed from InGaN.

An electric current injected into the active layer 204 through the p-side electrode 208p and the n-side electrode 208n causes a population inversion to occur in the active layer 204, resulting in light amplification by stimulated emission of radiation at a desired oscillation wavelength, i.e., laser oscillation.

In this embodiment, the plurality of light emitting elements 20 provided in the light source device 100 includes a first light emitting element 20a, a second light emitting element 20b, and a third light emitting element 20c. The first light emitting element 20a, the second light emitting element 20b, and the third light emitting element 20c are VCSEL elements, and emit light of different peak wavelengths from one another selected from among blue, green, and red.

In the present disclosure, blue light refers to the light having a peak emission wavelength falling within the range of 420 nm to 494 nm. Green light refers to the light having a peak emission wavelength falling within the rang e of 495 nm to 570 nm. Red light refers to the light having a peak emission wavelength falling within the range of 605 nm to 750 nm.

The first light emitting element 20a, the second light emitting element 20b, and the third light emitting element 20c are disposed on the support face 10A of the substrate 10. Each light emitting element 20 has an electrode pair 208, including a p-side electrode 208p and an n-side electrode 208n. At least one of the p-side electrode 208p and the n-side electrode 208n is electrically connected to the first wiring layer 13 disposed on the support face 10A. Consequently, the substrate 10 is electrically connected to and in thermal contact with at least one of the p-side electrode 208p and the n-side electrode 208n. This can improve heat dissipation properties. From the perspective of further improving heat dissipation properties, the light emitting elements 20 may be disposed on the support face 10A via a submount on which a conductor wiring layer is disposed in a similar manner as the substrate 10.

In the example of the light source device 100 shown in FIG. 2, the first light emitting element 20a, the second light emitting element 20b, and the third light emitting element 20c are each disposed on the substrate 10A such that the electrode pair 208 illustrated in FIG. 3B faces the support face 10A, i.e., turned upside down from the state shown in FIG. 3A in which the electrode pair 208 faces the +Y direction. The electrode pair 208 is positioned opposite the light emission face 21 of a light emitting element 20. The electrode pair 208 is electrically connected to the first wiring layer 13 of the substrate 10, and in thermal contact with the substrate 10. Such a layout can be applied, for example, to a light emitting element 20 that emits green or blue light. However, it may be applied to a light emitting element 20 that emits red light. Furthermore, the first light emitting element 20a, the second light emitting element 20b, and the third light emitting element 20c can be disposed on the substrate 10 in the state illustrated in FIG. 3A in which the electrode pair 208 faces the +Y direction such that the electrode pair 208 faces the planar lightwave circuit 40. In this case, the electrode pair 208 is located on the same side as the light emission face 21 of a light emitting element 20. Such a layout is applicable to a red light emitting element 20, for example. However, it may be applied to a green or blue light emitting element 20.

The light emitting element 20a emits first light upward from the light emission face 21 (in the Y direction). The light emitting element 20b emits second light upward from the light emission face 21. The light emitting element 20c emits third light upward from the light emission face 21. The first light, the second light, and the third light are red light, green light, and blue light, respectively, for example.

Optical Member 30

Each optical member 30 has a lens part 31 that collects light and a retaining part 32 for retaining the lens part 31. The lens part 31 can include one or more lenses among spherical lenses, such as biconvex lenses and plano-convex lenses, and aspheric lenses. The optical member 30 can be formed, for example, from at least one selected from the group consisting of glass, quartz, synthetic quartz, sapphire, transparent ceramic, and plastic. The lens part 31 and the retaining part 32 may be integrally formed from the same material, or formed independently from different materials. In the case of forming them independently, the retaining part 32 may be formed from a metal or ceramic material.

Figure 4:
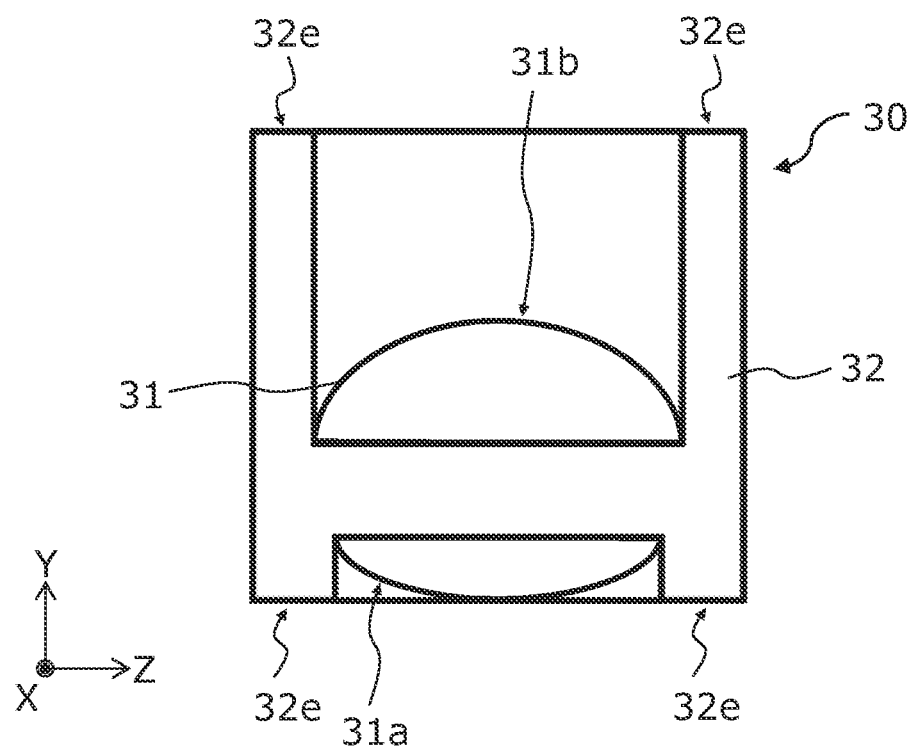
FIG. 4 is a diagram illustrating an example of the structure of an optical member.

FIG. 4 is a diagram illustrating an example of the structure of the optical member 30. The details will be discussed below, but FIG. 4 is a cross section in the YZ plane of the optical member 30. The optical member 30 illustrated in FIG. 4 has a structure in which the lens part 31 and the retaining part 32 are integrally formed. However, the lens part 31 and the retaining part 32 may be individual members. In this case, the retaining part 32 may be a spacer attached to the end face of the lens part 31, or the lens part 31 may be disposed in a tubular retaining part 32. The optical member 30 illustrated in FIG. 4 has a substantially rectangular cuboid shape as a whole, but the shape is not limited to this. For example, the size of the optical member 30 in the X direction and the Z direction is about 0.2 mm to about 1.0 mm, and the thickness (height) in the Y direction is about 0.2 mm to about 1.0 mm.

The light source device 100 can include as many optical members 30 as, and corresponding to, the light emitting elements 20. In the light source device 100 illustrated in FIG. 2, the optical members 30 include a first optical member 30a, a second optical member 30b, and a third optical member 30c corresponding to the light emitting element 20a, the light emitting element 20b, and the light emitting element 20c, respectively. Hereinafter, the first optical member 30a, the second optical member 30b, and the third optical member 30c will be referred to as the optical member 30a, the optical member 30b, and the optical member 30c, respectively.

The optical member 30a is positioned between the light emitting element 20a and the planar lightwave circuit 40, and is configured to collect the first light exiting from the light emitting element 20a on the light incident face of the planar lightwave circuit 40 described below. Similarly, the optical member 30b is positioned between the light emitting element 20b and the planar lightwave circuit 40, and is configured to collect the second light exiting from the light emitting element 20b on the light incident face of the planar lightwave circuit 40. The optical member 30c is positioned between the light emitting element 20c and the planar lightwave circuit 40, and is configured to collect the third light exiting from the light emitting element 20c on the light incident face of the planar lightwave circuit 40. Each optical member 30 is positioned such that its focal point coincides with the emission point of the corresponding light emitting element 20.

Figure 5:
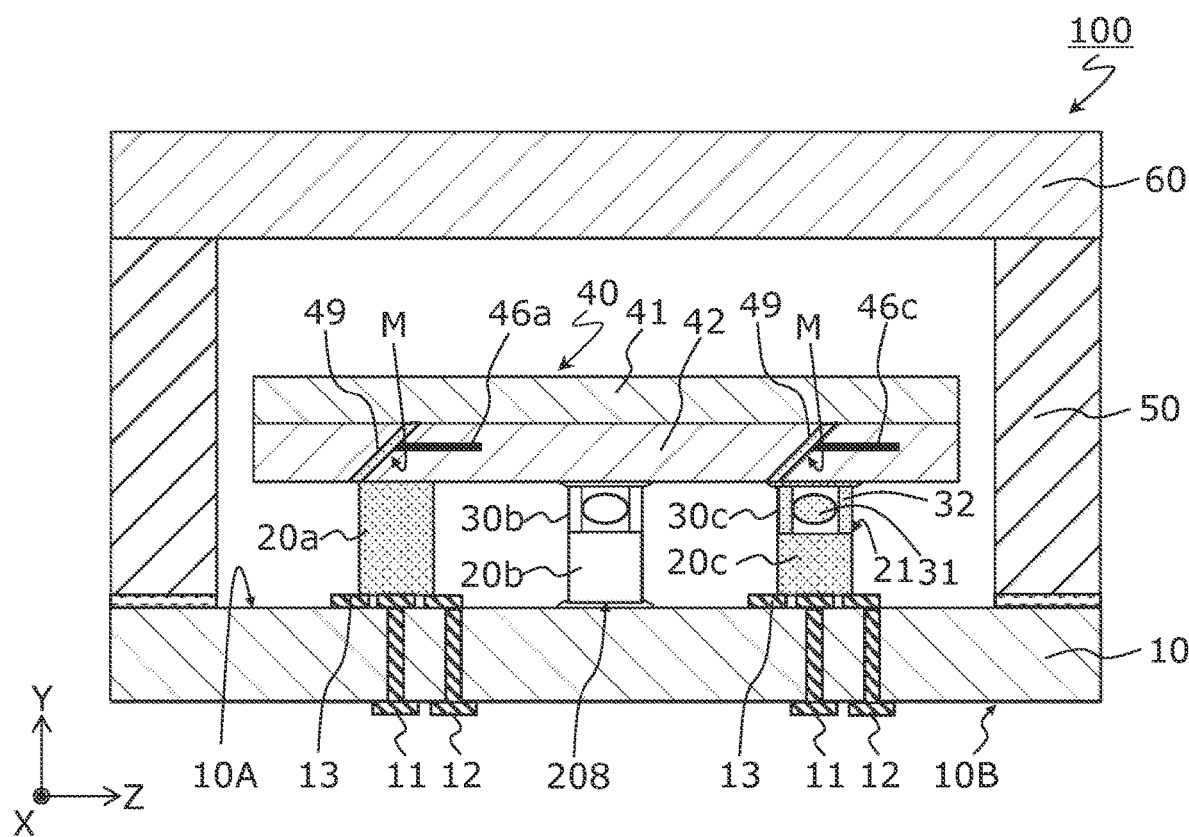
FIG. 5 is a cross-sectional view in the YZ plane of another example of the structure of the light source device according to the exemplary embodiment of the present disclosure.

Employing optical members 30 can improve the optical coupling efficiency to the optical waveguides disposed in the planar lightwave circuit 40 described below. However, the optical members 30 are not essential. For example, in the case of employing VCSEL elements having emission points closer to the PLC than to the substrate, the optical members 30 are not essential because the exiting light can enter the PLC before spreading. FIG. 5 illustrates an example of the structure of the light source device 100 that has no optical member 30a that corresponds to the light emitting element 20a among the three light emitting elements 20. Consequently, the number of optical members 30 does not have to match the number of light emitting elements 20.

Planar Lightwave Circuit 40

Figure 6:
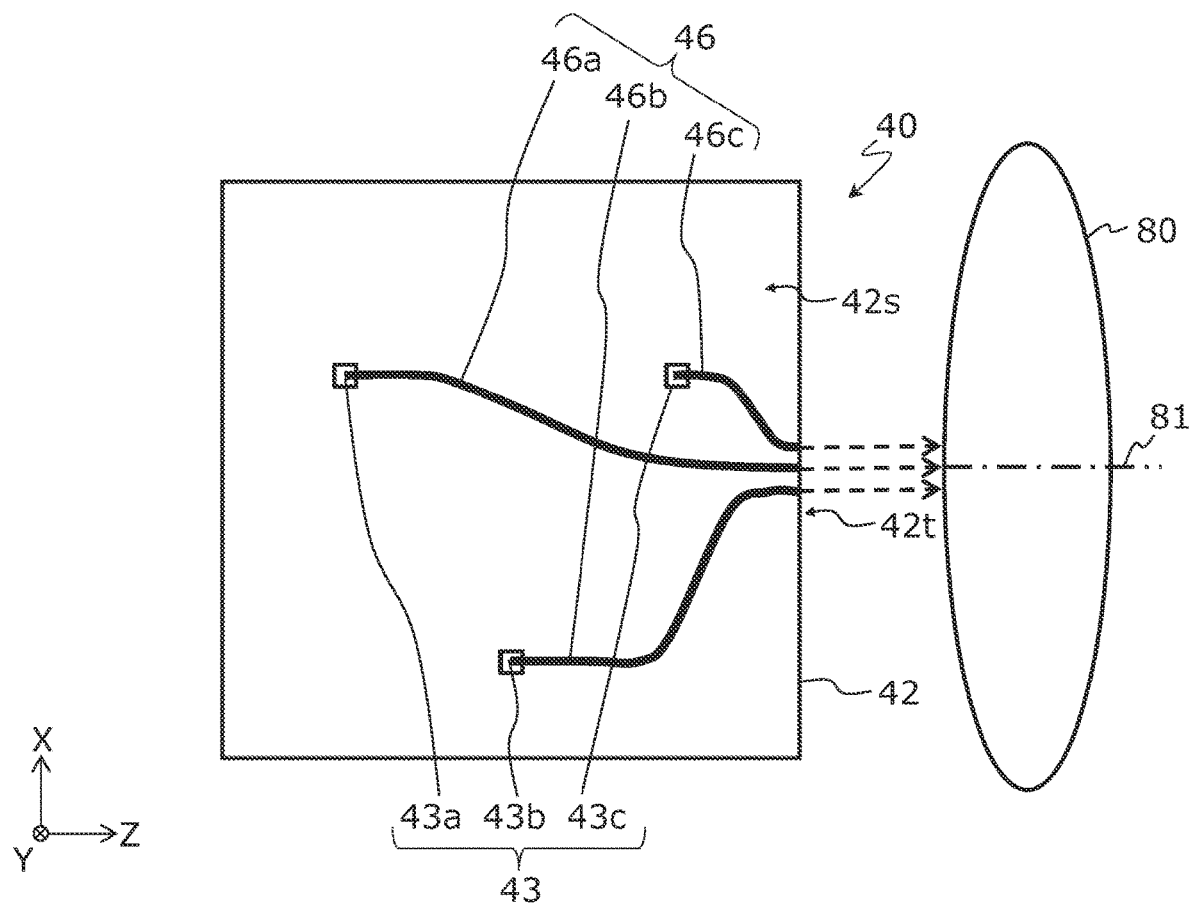
FIG. 6 is a diagram schematically showing the light incident face of a planar lightwave circuit when viewed in the Y direction from the −Y side.
Figure 7:
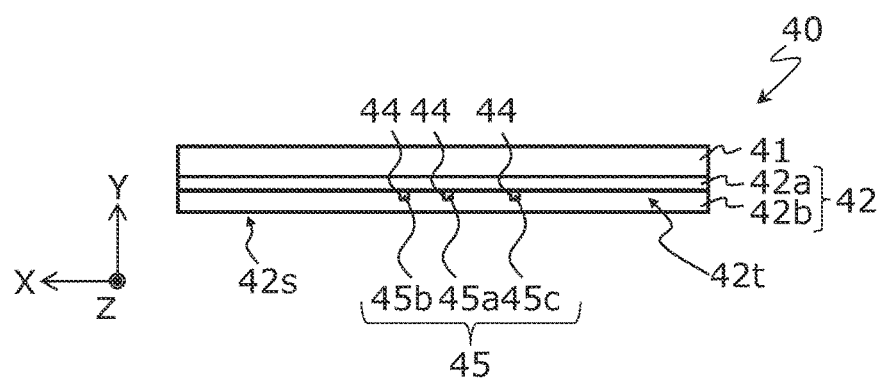
FIG. 7 is a diagram schematically showing the light emission face of the planar lightwave circuit when viewed in the Z direction from the +Z side.

FIG. 6 is a diagram schematically showing the light incident face 42s of a planar lightwave circuit 40 viewed in the Y direction from the −Y side. FIG. 7 is a diagram schematically showing the light emission face 42t of the planar lightwave circuit 40 viewed in the Z direction from the +Z side.

The planar lightwave circuit (PLC) 40 illustrated in FIG. 6 and FIG. 7 includes a substrate 41, an underclad layer 42a formed on the surface of the substrate 41, a plurality of waveguide cores 44 formed on the underclad layer 42a, and an overclad layer 42b covering the waveguide cores 44. In the description below, a planar lightwave circuit will be referred to as a "PLC." The underclad layer 42a and the overclad layer 42b will be collectively referred to as the "clad layers 42."

The thickness of each of the underclad layer 42a and the overclad layer 42b falls within the 10 μm to 100 μm range, for example. The height (thickness) and the width of each waveguide core 44 fall within the range of 1 μm to 10 μm, for example. In the example shown in FIG. 7, the cross section of each waveguide core 44 perpendicular to the waveguiding direction is quadrangular, but may be circular or elliptical. The size of each waveguide core 44 is larger in the case of performing multimode waveguiding than in the case of single mode waveguiding. In this embodiment, the size of each waveguide core 44 is selected for performing single mode waveguiding. For example, when the wavelength of the light is 455 nm, the height and width of the waveguide core 44 can be in the range of 1 μm to 3 μm each.

The substrate 41, the waveguide cores 44, and the clad layers 42 can be formed from an inorganic material, such as silicon or quartz, or an organic material, such as plastic or resin. When the substrate is formed from an inorganic material, the waveguide cores and the clad layers can also be formed from an inorganic material. When the substrate is formed from a resin material, the waveguide cores and the clad layers can also be formed from a resin material.

The PLC 40 has a light incident face 42s on the surface that faces the support face 10A from which light becomes incident. A plurality of light incident regions 43 are provided in the light incident face 42s. The PLC 40 has a light emission face 42t through which the light incident on the light incident face 42s exits. A plurality of light emission ends 45 are provided in the light emission face 42t. In manufacturing a PLC 40, because the surface of the overclad layer 42b disposed to cover the waveguide cores 44 on the underclad layer 42a has recesses and protrusions, it is preferable to polish the surface.

The outline of the PLC 40 illustrated in FIG. 6 is substantially square shaped, but is not limited to this. The shape can be, for example, rectangular. The size of the substrate 10 in the XZ plane (see FIG. 1) is larger than the size of the PLC 40 in the XZ plane. For example, the size difference between the substrate 10 and the PLC 40 can be about in the range of 0.4 mm to about 2.0 mm in both the X direction and the Z direction. The size of the PLC 40 in the X direction and the Z direction is, for example, about 0.1 mm to about 10.0 mm each. The thickness of the lateral wall part 50 in the Y direction (see FIG. 2) is larger than the thickness of the PLC 40 in the Y direction. For example, the thickness difference between the lateral wall part 50 and the PLC 40 can be about 0.5 mm to about 2.3 mm. The thickness of the PLC 40 in the Y direction is, for example, in the range of about 0.4 mm to about 1.5 mm.

The PLC 40 has a plurality of optical waveguides 46 that allows the exiting light from the plurality of light emitting elements 20 to become incident on the light incident face 42s and be respectively waveguided. No particular restrictions apply to the structure of each optical waveguide 46, and any appropriate structure capable of functioning as an optical waveguide can be employed.

The waveguide cores 44 are formed from a material having a higher refractive index than their surroundings, and can exhibit light confinement effects. The light beams exiting the optical waveguides 46 advance in the directions indicated by the right arrows of broken lines in FIG. 6 while spreading at a predetermined angle.

In this embodiment, the light incident regions 43 include first, second, and third light incident regions 43a to 43c. The light emission ends 45 include first, second, and third light emission ends 45a to 45c. The optical waveguides 46 include first, second, and third optical waveguides 46a to 46c. The first optical waveguide 46a allows the exiting first light from the light emitting element 20a to become incident on the first light incident region 43a and exit the first light emission end 45a in the direction in parallel with the support face 10A. The second optical waveguide 46b allows the exiting second light from the light emitting element 20b to become incident on the second light incident region 43b and exit the second light emission end 45b in the direction in parallel with the support face 10A. The third optical waveguide 46c allows the exiting third light from the light emitting element 20c to become incident on the third light incident region 43c and exit the third light emission end 45c in the direction in parallel with the support face 10A. In this embodiment, the first to third light is allowed to become incident perpendicularly on the first to third light incident regions 43a to 43c, but it does not have to be.

In the example shown in FIG. 6 and FIG. 7, the light incident face 42s is a plane that substantially parallels the support face 10A shown in FIG. 2. The light emission face 42t is located in a lateral face of the PLC 40. The light emission face 42t, in a plan view, extends in parallel with the inner face of the lateral wall part described below. However, the light emission face 42t may be oblique to the inner face of the lateral wall part.

An antireflective film may be disposed on the light incident face 42s and/or the light emission face 42t. For example, an antireflective film is a dielectric film. Adjusting the refractive index of the dielectric film makes it possible to utilize the optical interference at the optical thin film to thereby control the reflectivity, achieving antireflective effects. Examples of dielectric materials are $TiO_2$, $Ta_2O_5$, $Al_2O_3$, $SiO_2$, or $MgF_2$. An antireflective film may be disposed on at least one of the following: the light emission face 21 of the light emitting element 20 and the lens faces of the lens part 31 on the light incident side and on the light output side described above.

The PLC 40 can be directly or indirectly supported by the light emitting elements 20. In the light source device 100 illustrated in FIG. 2, the PLC 40 is supported by the light emitting elements 20 via the optical members 30. The optical member 30a is bonded to the light emitting element 20a and the first light incident region 43a. The optical member 30b is bonded to the light emitting element 20b and the second light incident region 43b. The optical member 30c is bonded to the light emitting element 20c and the third light incident region 43c. According to such a structure, the optical member 30a, the optical member 30b, and the optical member 30c can improve the optical coupling efficiency of the first light to the first optical waveguide 46a, the optical coupling efficiency of the second light to the second waveguide 46b, and the optical coupling efficiency of the third light to the third optical waveguide 46c, respectively.

In the case in which light emitting elements 20 directly or indirectly support a PLC 40, a gap can be created between the PLC 40 and a light emitting element 20 or an optical member 30 attributable to height variations among the light emitting elements 20 and/or the optical members 30. However, the numerical aperture (NA) of a VCSEL element is generally smaller than the NA of an edge-emitting laser. For example, the NA of a VCSEL element is in the range of about 0.1 to about 0.3, whereas the NA of an edge-emitting laser is in the range of about 0.25 to about 0.7. Accordingly, by utilizing VCSEL elements as in the case of this embodiment, even if a gap is created between the PLC 40 and a light emitting element 20 or optical member 30, the impact of such a gap can be reduced. This allows the light exiting from the light emitting elements 20 to become incident on the light incident regions 43 of the PLC 40 in an efficient manner.

Referring back to FIG. 4, the bonding between a light emitting element 20 and an optical member 30, and between the optical member 30 and the PLC 40 can be achieved by using an adhesive. In this case, the adhesive layer formed from an adhesive is preferably absent on the incident side lens face 31a and the output side lens face 31b of the optical member 30. In other words, it is preferable to apply an adhesive on the end faces 32e of the retaining part 32 of the optical member 30 to bond the light emitting element 20 and the optical member 30, and bond the optical member 30 and the PLC 40. In the case in which an adhesive layer is present on at least one of the incident side lens face 31a and the output side lens face 31b of the optical member 30, the refractive index of the adhesive is preferably a value between the refractive indices of the two bonded members. With this refractive index relationship, even when the adhesive layer is positioned in the optical path of the laser beam, the impact thereof can be reduced. The light emitting elements 20 can also be bonded to the PLC 40 using an adhesive in the case in which optical members 30 are absent. Examples of adhesives include photosetting resins such as UV curable resins, thermosetting resins, or inorganic adhesives. Besides these, metals such as a gold-tin alloy, solder alloy, or the like, may be used.

The distance between the centers of two light emission ends 45 among the three light emission ends 45 is shorter than the distance between the centers of the two light incident regions 43 corresponding to the two light emission ends 45. For example, the distance between the centers of the first light emission end 45a and the second light emission end 45b is shorter than the distance between the centers of the first light incident region 43a and the second light incident region 43b. The distance between the centers of two adjacent light emission ends 45 among the first light emission end 45a, the second first light emission end 45b, and the third light emission end 45c corresponds to the distance between the centers of two adjacent light emission points in the light emission face 42t of the PLC 40. The distance between the centers of two emission points can fall, for example, within the range of the 2 µm to 200 µm, preferably within the range of the 2 µm to 100 µm. Because the distance between the centers of the emission points can be reduced, when employing RGB light emitting elements, the exiting light from the light emitting elements can be combined to readily achieve white light.

By combining the PLC 40 configured as above with a plurality of light emitting elements 20, the distances between the centers of the emission points in the light emission face 42t of the PLC 40 can be made smaller than the allowable minimum distance between the centers of the light emitting elements 20 (e.g., 250 µm), which is determined by the element size and the margin during mounting. The reduced distances between the centers of the emission points in the light emission face 42t allows the multiple emission points to be positioned near the optical axis of the lens, and thus can reduce the lens size. This also provides the benefit of making it easy to adjust the alignment of the optical systems that control the light exiting from each emission point. For example, there is no need for multiple lenses for collimating light, allowing a single lens to collimate light as illustrated in FIG. 6.

The PLC 40 can have one or more mirror faces M. A mirror face M can be formed, for example, by creating a slit 49 in the clad layer 42 of the PLC 40. The slit 49 can be formed by making a cut in the clad layer 42 of the PLC 40. The interface between the clad layer 42 and the air layer in the slit 49 functions as a mirror face M that reflects light utilizing the refractive index differences. In the case of forming a PLC 40 with silicon, silicon oxide may be used to fill the slit 49. The PLC 40 in this embodiment has three mirror faces M respectively corresponding to the three light emitting elements 20a to 20c. The light exiting the light emitting elements 20 in the direction of the normal to the support face 10A is reflected by the mirror faces M reflect towards the direction in parallel with the support face 10A (+Z direction) to be connected to the waveguide cores 44.

Because the resonator length L of a VCSEL element is relatively short, the longitudinal mode interval Δλ is large. Here, the longitudinal mode interval Δλ is represented by the formula 1 below that takes wavelength dispersion of refractive index n into consideration. Accordingly, the number of longitudinal modes can easily become one, and thus a VCSEL element can oscillate in a single longitudinal mode.

$$\Delta\lambda = \lambda^2 / [2nL(1-(dn/d\lambda)\cdot(\lambda/n))]$$  Formula 1

For the mirror faces M of the PLC 40, diffraction gratings may be used in place of the slits 49. As described above, because a VCSEL element can oscillate in a single longitudinal mode, it is compatible with a diffraction grating. In the case of using diffraction gratings, because the diffraction angle depends on wavelength, a VCSEL element having a small spectral width is preferably used as a light emitting element 20.

Figure 8:
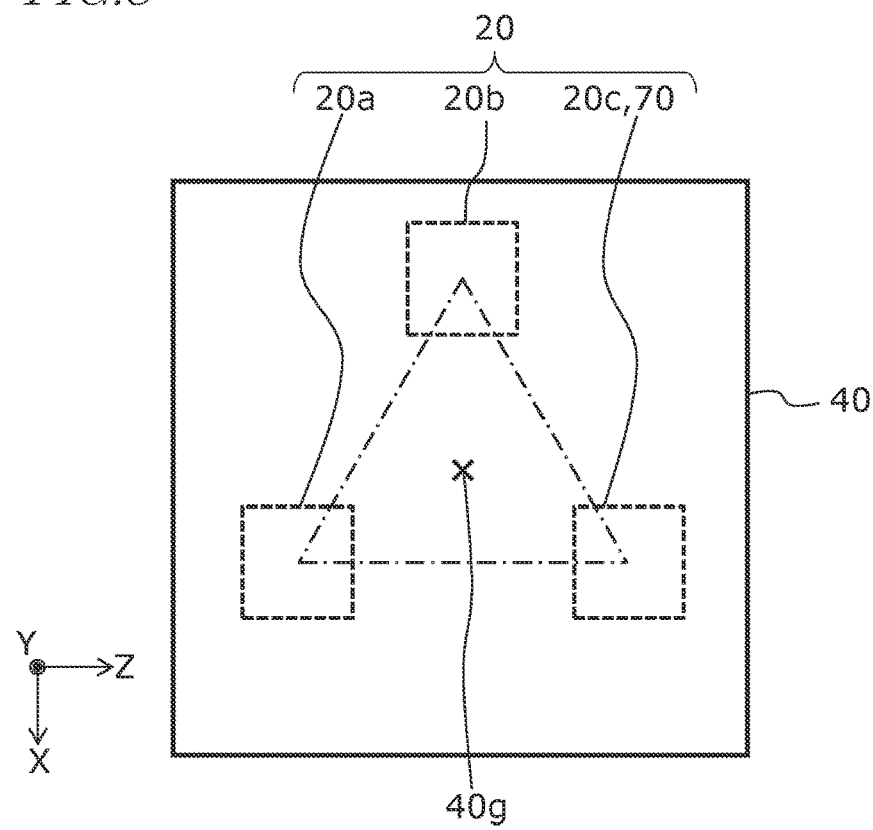
FIG. 8 is a plan view of a planar lightwave circuit supported by three vertical-cavity surface-emitting laser elements viewed in the Y direction from the +Y side.

FIG. 8 is a plan view of a PLC 40 supported by three light emitting elements 20 when viewed in the Y direction from the +Y side. In FIG. 8, the three light emitting elements 20 disposed under the PLC 40 are indicated with broken lines for explanation purposes. The triangle formed by virtual lines connecting the centers of the three light emitting elements 20a to 20c is indicated with one dot chain lines.

The center of gravity 40g of the PLC 40 in this embodiment can be positioned inside the geometric shape formed by virtual lines connecting the centers of light emitting elements 20. The distance between the center of gravity 40g of the PLC 40 and the center of gravity of the geometric shape formed by the virtual line connecting the centers of the light emitting elements 20 can be, for example, 1 mm at most. The center of gravity 40g of the PLC 40 illustrated in FIG. 8 is positioned in the triangle formed by the virtual line connecting the centers of the three light emitting elements 20a to 20c, and coincides with the center of gravity of the triangle. Such a layout can improve stability when mounting the PLC.

Figure 9:
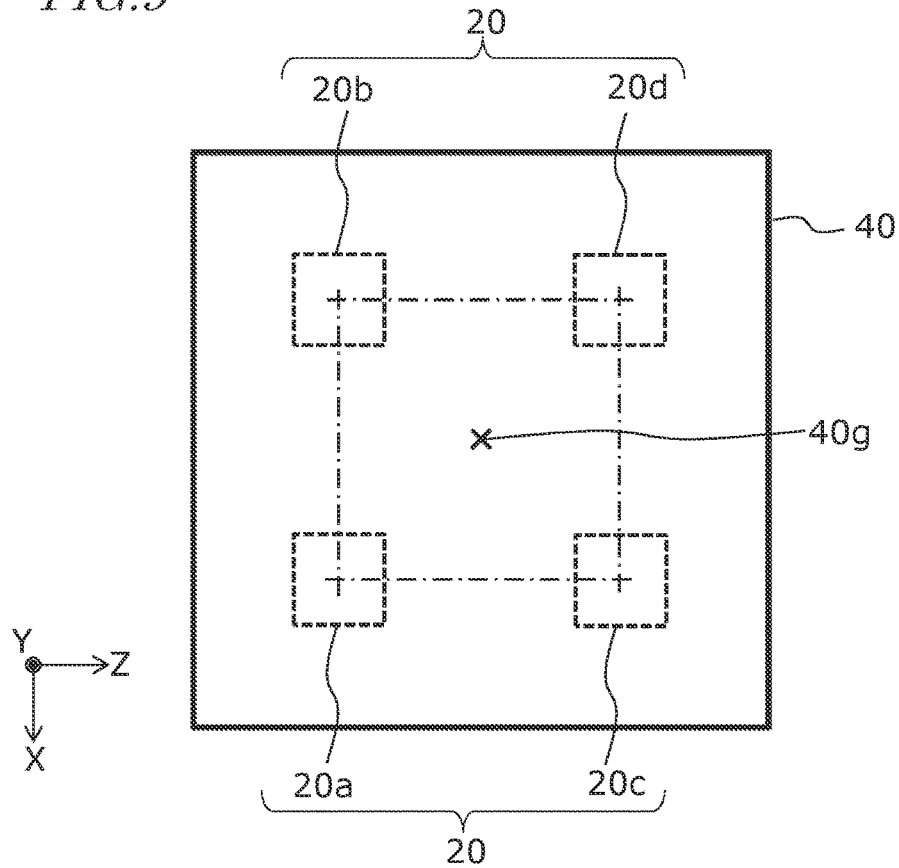
FIG. 9 is a plan view of a planar lightwave circuit supported by four vertical-cavity surface-emitting laser elements viewed in the Y direction from +Y side.

FIG. 9 is a plan view of a PLC 40 supported by four light emitting elements 20 when viewed in the Y direction from the +Y side. In FIG. 9, the four light emitting elements 20 disposed under the PLC 40 are indicated with broken lines for explanation purposes. The plurality of light emitting elements 20 in this embodiment can further include a fourth light emitting element 20d (hereinafter referred to as "light emitting element 20d"). The four light emitting elements 20a to 20d illustrated in FIG. 9 emit light having different peak wavelengths from one another selected from among blue, green, red, and infrared. In FIG. 9, the quadrangle formed by virtual lines connecting the centers of the light emitting elements 20 is indicated by using one dot chain lines. The center of gravity 40g of the PLC 40 is located in the quadrangle, and coincides with the center of gravity of the quadrangle. The layout of supporting the PLC 40 at four points can also improve the stability when mounting the PLC 40.

According to a light source device in this embodiment, heat dissipation properties can be improved as the light emitting elements are bonded to the substrate, and multiple emission points can be positioned near the optical axis of a lens as the PLC is combined with the light emitting elements to thereby improve light collecting properties. This can contribute to the miniaturization of a light source device. This can achieve a light source device that exhibits both good heat dissipation and good light collection. In the case of bonding light emitting elements that support a PLC to a substrate, bonding stability is needed. According to this embodiment, bonding stability can be improved, for example, as the center of gravity of the PLC coincides with the center of gravity of the shape formed by virtual lines connecting the centers of light emitting elements.

A light source device according to this embodiment can further include one or more support members. The light source device 101 described below differs from the light source device 100 in that one of the light emitting elements 20 is replaced with a support member.

Figure 10:
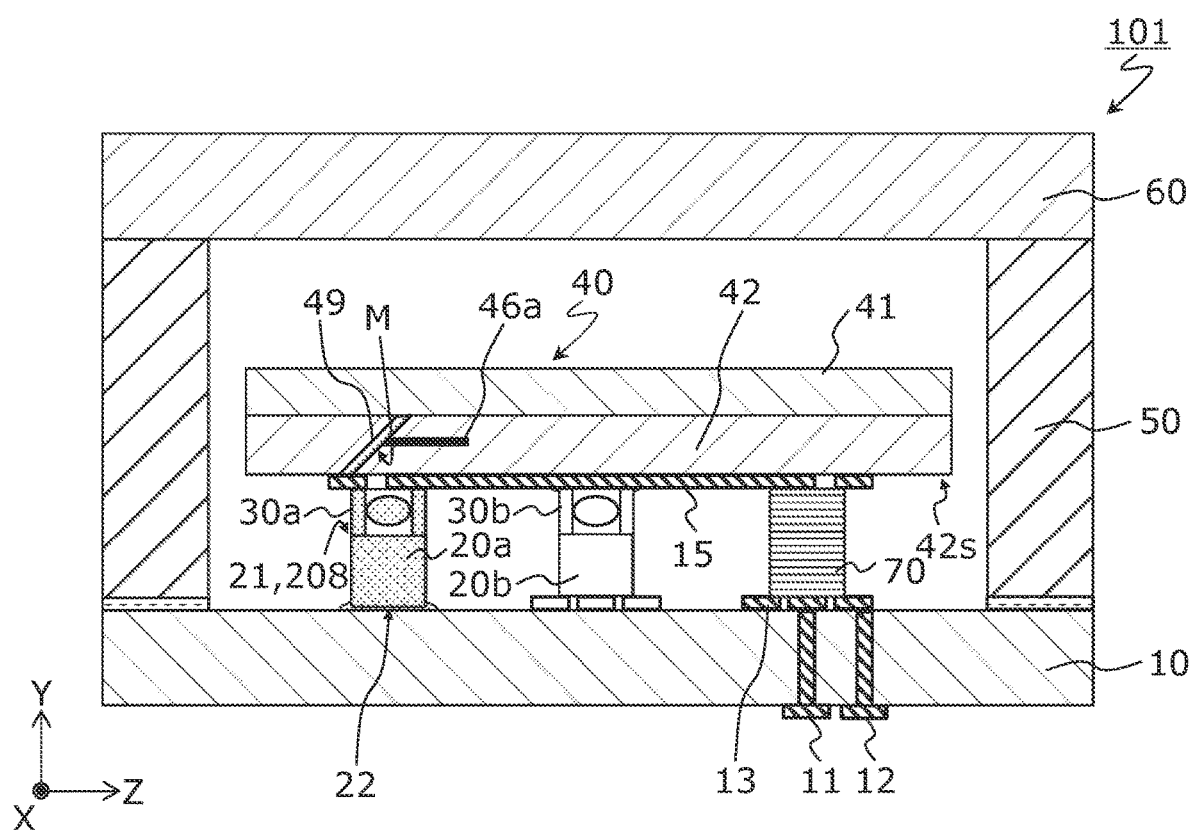
FIG. 10 is a cross-sectional view in the YZ plane of yet another example of the structure of the light source device according to the exemplary embodiment of the present disclosure.

FIG. 10 is a cross-sectional view in the YZ plane of the light source device 101. The light source device 101 illustrated in FIG. 10 has two light emitting elements 20a and 20b, and a support member 70. The numbers of the light emitting elements 20 and the support members 70 are not limited to these.

FIG. 8 is a plan view of the PLC 40 in the light source device 101 when viewed in the Y direction from the +Y side. As is understood from FIG. 10, the light source device 101 has a structure in which the third light emitting element 20c of the light source device 100 is replaced with a support member 70. When viewed from above, the center of gravity 40g of the PLC 40 corresponding to that in the example shown in FIG. 8 is positioned in the triangle formed by virtual lines connecting the centers of the light emitting elements 20a and 20b and the support member 70, and coincides with the center of gravity of the triangle.

In the case in which a light source device includes two light emitting elements 20, for example, using a support member 70 can maintain the stability in a similar manner to that achieved by three light emitting elements 20 when mounting a PLC 40. Furthermore, stability can be similarly improved when mounting a PLC 40 by using two support members 70. Such a light source device has the structure corresponding to that illustrated in FIG. 9 in which two of the four light emitting elements 20 are replaced with two support members 70.

A support member 70 is a quadrangular prism or cylindrical member, for example, and is preferably formed from a metal, silicon, glass, ceramic or the same material as that for the substrate 10 described above, more preferably a material having a linear expansion coefficient close to that of the light emitting elements 20. Examples of such materials include AlN, SiC, GaN, $Al_2O_3$, and Si. In the case of using a ceramic material for a support member 70, LTCC (low temperature co-fired ceramic) may be used.

In a certain embodiment, a light source device can include a light receiving element (e.g., photodiode) optically connected to a branched portion of an optical waveguide 46 to allow a portion of the light exiting from a light emitting element to be incident thereon to detect the intensity. The light receiving element can also function as a member to support the PLC. A light receiving element that can also serve as a support member can monitor the light output from the light emitting element while maintaining the stability of the PLC.

In the light source device 101 illustrated in FIG. 10, the PLC 40 has, at the light incident face 42s a second wiring layer 15 that is electrically connected to the support member 70. The support member 70 has conductivity, and electrically connects the light emitting element 20a and the first wiring layer 13. The light emitting element 20a has a lower face 22 that is bonded to the support face 10A and an electrode pair 20S including a p-side electrode and an n-side electrode positioned on the opposite side of the lower face 22. The light emission face 21 and the electrode pair 20S are positioned on the same side. The p-side electrode and the n-side electrode are electrically connected to the second wiring layer 15 by forming the retaining part of the optical member 30a from a conductive material or forming a wiring on the retaining part by using a conductive ink, and are electrically connected to the first wiring layer 13 via the second wiring layer 15 and the support member 70. The p-side electrode, the n-side electrode, and the second wiring layer 15 may be formed from a material having light transmissivity with respect to the wavelength of the light emitted by the light emitting element 20. For such a material, for example, a transparent conductive material having a base material such as ITO, IZO, IFO, SnO, or ZnO can be used. The p-side electrode, the n-side electrode, and the second wiring layer 15 are more preferably formed in the areas where no light passes through. They may be formed, for example, from a material such as a conductive ink, gold, platinum, ruthenium, nickel, or titanium.

The support member 70 having conductivity can have, for example, an internal conductor, an insulator covering the internal conductor, and an external conductor covering the insulator. In the example shown in FIG. 10, the internal conductor is electrically connected to the external connection electrode 11 via the first wiring layer 13, and the external conductor is electrically connected to the external connection electrode 12 via the first wiring layer 13. In the case in which the p-side electrode and the n-side electrode are positioned on the same side as the light emission face 21, using a support member 70 having such a conductor structure makes it possible, for example, to electrically connect the p-side electrode to the external connection electrode 11 via the internal conductor of the support member 70 while electrically connecting the n-side electrode to the external connection electrode 12 via the external conductor of the support member 70. Not limited to this example, in addition to the support member 70 for electrically connecting the p-side electrode and the external connection electrode 11, another support member 70 for electrically connecting the n-side electrode and the external connection electrode 12 may be used. Using a support member 70 having conductivity can make conventional wire bonding unnecessary to thereby simplify the wiring tasks.

In the case in which the light source device 101 further includes a light emitting element 20c, the support member 70 can electrically connect at least one of the three light emitting elements 20a to 20c to the first wiring layer 13. For example, among the RGB light emitting elements 20a to 20c, the red light emitting element 20a in which the light emission face 21 and the electrode pair 208 can be positioned on the same side can be electrically connected to the external connection electrodes 11 and 12 by using the support member 70.

Lateral Wall Part 50

Referring back to FIG. 2, the lateral wall part 50 is disposed to surround the light emitting elements 20 and bonded to the peripheral region of the support face 10A. The Lateral wall part 50 has an upper face 50a, a lower face 50b, and inner wall faces 50c. The inner wall faces 50c surround and define the space V for housing the light emitting elements 20. The lower face 50b of the lateral wall part 50 is bonded to the support face 10A of the substrate 10. The bonding can be accomplished via a bonding part made of an inorganic or organic material. For the material for the bonding part, for example, a metal, such as a gold-tin or solder alloy, or a metal paste, such as a gold paste or silver paste can be used. However, a blue or green light emitting VCSEL element that has high optical density attracts dust derived from organic materials. Accordingly, the use of an organic material is preferably avoided in that case.

The lateral wall part 50 is positioned on the support face 10A in the paths of the laser beams emitted from the light emitting elements 20, and transmits the laser beams. At least the portion of the lateral wall part 50 where the laser beams pass through can be formed with a material such as alkali glass, alkali-free glass, sapphire, glass containing a phosphor, transparent ceramic material, or the like. The portion of the lateral wall part 50 where the laser beams do not pass through may be formed with, for example, silicon, glass, ceramic, or the same material as that for the substrate 10 described above. Furthermore, at least a portion of the lateral wall part 50 may be integrally formed with the substrate 10. The lateral wall part 50 may have the ability to function as a condensing or collimating lens.

Lid Member 60

The lid member 60 illustrated is a sheet shaped member and functions as a cap to seal the space V that houses the light emitting elements 20. The space V is preferably hermetically sealed. Hermetically sealed in the present specification means that the space V is sealed to the extent that the interaction with outside air is blocked. When hermetically sealed, the members disposed in the space V is less likely to practically degrade. Furthermore, the impact of dust can be reduced. The lid member 60, for example, can be formed from the same material as that for the lateral wall part 50 described above. Moreover, at least a portion of the lid member 60 may be integrally formed with the lateral wall part 50.

The light source device 100 or 101 according to this embodiment can include a reflective member having a reflective face to reflect the light exiting the light emission face 42t of the PLC 40 in parallel with the support face 10A upwards (Y direction). The reflective member is formed from a material such as a metal or glass, and the reflective face may be provided with a reflective film. The reflective member is disposed directly or indirectly on the support face 10A. The light reflected by the reflective face can pass and exit through the lid member 60. At least the portion of the lid member 60 through which laser beams pass can be formed from the same material as that for the portion of the lateral wall part 50 through which laser beams pass described above. The lid member 60 may have the ability to function as a condensing or collimating lens.

A variation of the light source device 100 according to this embodiment will be explained with reference to FIG. 11 and FIG. 12. The variation of the light source device includes light emitting elements 20-1 each having a plurality of emitters, optical members 30-1 each including an optical array, and a PLC 40-1 in which each optical waveguide includes a plurality of optical waveguide parts.

Figure 11:
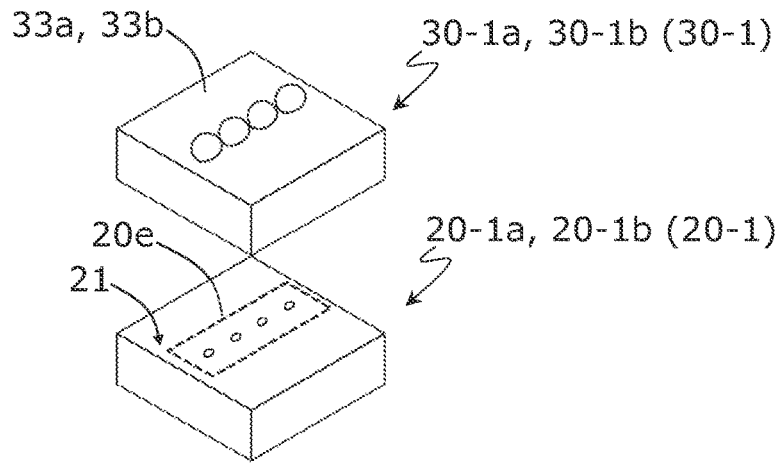
FIG. 11 is an exploded view of an optical member that includes a vertical-cavity surface-emitting laser element having multiple emitters and an optical array.

FIG. 11 is an exploded view of a light emitting element 20-1 having a plurality of emitters and an optical member 30-1 including an optical array. FIG. 12 is a plan view of the PLC 40-1 when viewed in the Y direction from the −Y side (the light incident face 42s).

In the example shown in FIG. 11, the light emitting element 20-1a has a light emission face 21 that includes a plurality of emitters 20e each emitting first light. Similarly, the light emitting element 20-1b has a light emission face 21 that includes a plurality of emitters 20e each emitting second light. The light emission face 21 includes four emitters 20e arranged in one row and four columns. The arrangement and the number of emitters 20e are not limited to this. The light emission face 21 can include m×n pieces of emitters 20e arranged in m rows and n columns (m and n are 2 or larger integers). The optical member 30-1a includes a first optical array 33a configured to collect the first light exiting the four emitters 20e of the light emitting element 20-1a. Similarly, the optical member 30-1b includes a second optical array 33b configured to collect the second light exiting the four emitters 20e of the light emitting element 20-1b. The first optical array 33a and the second optical array 33b each have four lenses arranged in one row and four columns in correspondence with the emitters 20e. However, the number of lenses does not have to match the number of emitters 20e. For example, the light exiting the four emitters 20e may be collected by using a single lens.

Figure 12:
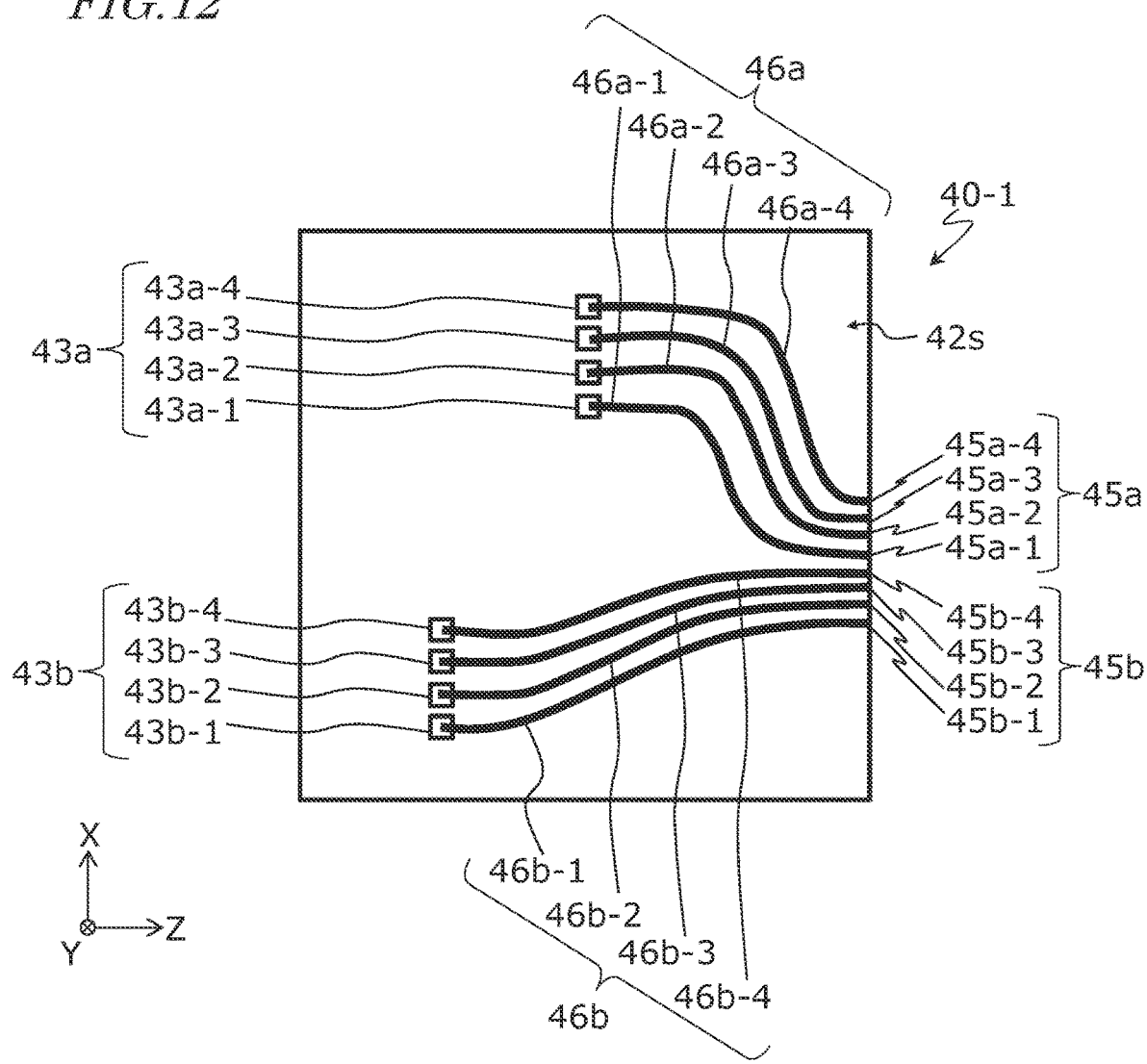
FIG. 12 is a plan view of another example of the structure of the planar lightwave circuit when viewed in the Y direction from the −Y side.

In the example shown in FIG. 12, the first light incident regions 43a include four first incident parts 43a-1 to 43a-4, and the second light incident regions 43b include four second incident parts 43b-1 to 43b-4. The first light emission ends 45a include four first emission parts 45a-1 to 45a-4, and the second light emission ends 45b include four second emission parts 45b-1 to 45b-4. The first optical waveguides 46a include four first optical waveguide parts 46a-1 to 46a-4 that respectively connect the four first incident parts 43a-1 to 43a-4 to the four first emission parts 45a-1 to 45a-4. The second optical waveguides 46b include four second optical waveguide parts 46b-1 to 46b-4 that respectively connect the four second incident parts 43b-1 to 43b-4 to the four second emission parts 45b-1 to 45b-4.

The first light that has passed through the first optical array 33a and entered the four first incident parts 43a-1 to 43a-4 is respectively reflected by the mirror faces, propagates through the four first optical waveguide parts 46a-1 to 46a-4, and exits the four first emission parts 45a-1 to 45a-4. The second light that has passed through the second optical array 33b and entered the four second incident parts 43b-1 to 43b-4 is respectively reflected by the mirror faces, propagates through the four second optical waveguide parts 46b-1 to 46b-4, and exits the four second emission parts 45b-1 to 45b-4.

According to this variation, providing as many light emission ends as the number of emitters makes it possible to maintain the pixel resolution when using the light source device in a display, for example.

Lastly, examples of the patterns of the first wiring layer 13 disposed on the support face 10A of the substrate 10 and the second wiring layer 15 disposed on the light incident face 42s of the PLC 40 will be explained with reference to FIG. 13 to FIG. 16.

Figure 13:
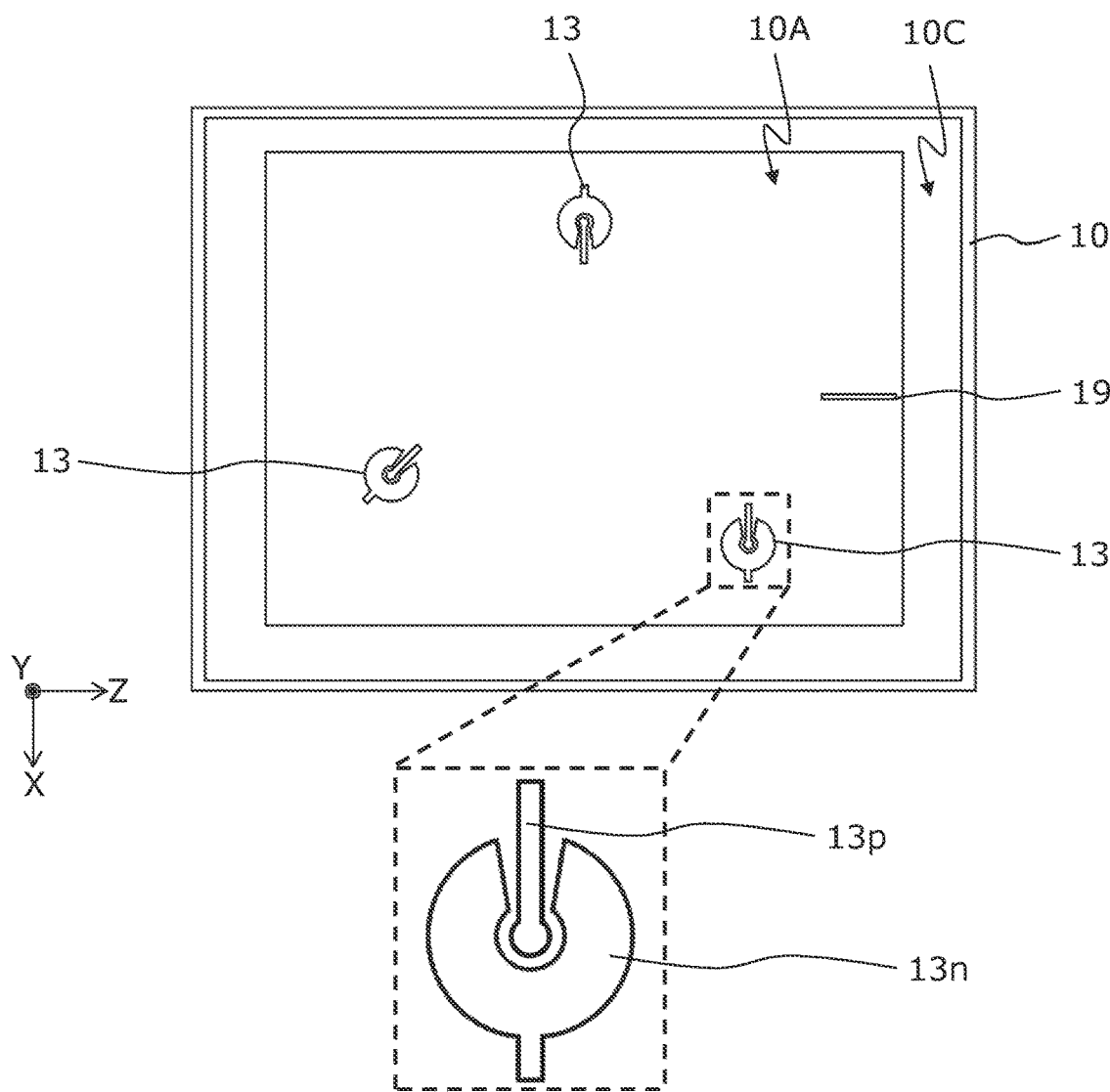
FIG. 13 is a diagram schematically showing an example of a first wiring layer pattern provided on the support face of the substrate.

FIG. 13 is a diagram showing an example of the pattern of the first wiring layer 13 disposed on the support face 10A of the substrate 10. FIG. 13 is an example of the pattern of the first wiring layer 13 in the case of disposing each light emitting element 20 on the substrate 10 such that the electrode pair 208 illustrated in FIG. 3B faces the support face 10A. The first wiring layer 13 includes a p-side wiring region 13p to be electrically connected to the p-side electrode 208p of the electrode pair 208, and an n-side wiring region 13n to be electrically connected to the n-side electrode 208n of the electrode pair 208. In this example, the n-side wiring region 13n is disposed on the support face 10A to partly surround the boundary of the p-side wiring region 13p. On the upper face of the substrate 10, a peripheral region 10C is provided to surround the support face 10A. As illustrated in FIG. 2, the lower face 50b of the lateral wall part 50 is bonded to the peripheral region 10C.

The shape of the first wiring layer 13 can be determined in accordance with the shape of an electrode pair 208. The first wiring layer 13 illustrated in FIG. 13 has the shape that corresponds to the electrode pair 208 illustrated in FIG. 3B. However, the shape, the angle (e.g., the direction in which the p-side wiring region 13p extends), and the position of the first wiring layer 13 shown in FIG. 13 are merely exemplary, and can be suitably modified.

On the upper face of the substrate 10 illustrated in FIG. 13, a marker 19 is provided. Specifically, the marker 19 is provided on the support face 10A near the light emission ends 45 (see FIG. 7) of the PLC 40 when viewed from above. The marker 19 identifies the emission positions of the laser beams exiting from the PLC 40. The shape and the size of the marker 19 are discretionary. When manufacturing a light source device, by using the marker 19 as a reference, a PLC 40 can be mounted on the substrate 10 in which the light emitting elements 20 are bonded to the first wiring layer 13. Consequently, the marker 19 is useful in manufacturing a light source device. Furthermore, providing a marker 19 near the light emission ends 45 of the PLC 40 makes it easier to identify the positions of the laser beams exiting from the PLC 40 when viewed from above.

Figure 14:
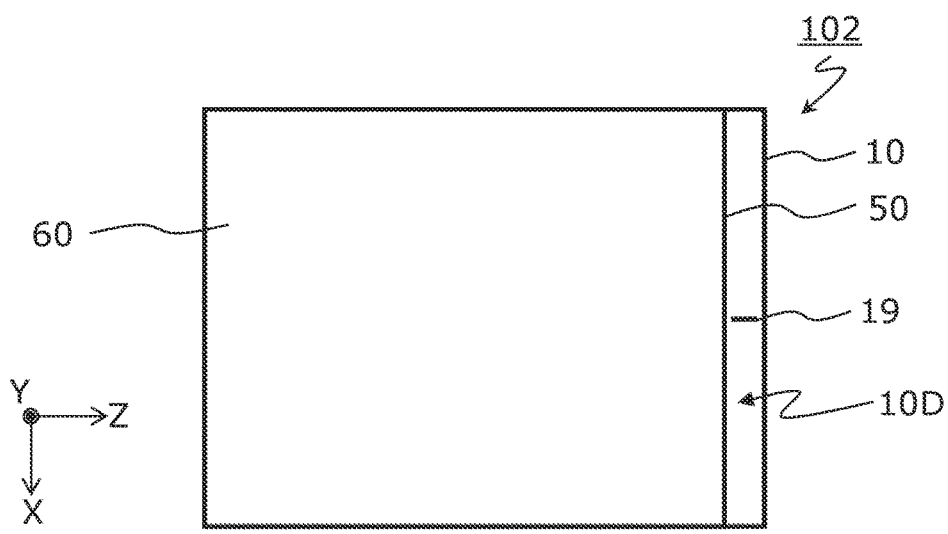
FIG. 14 is a top view of a light source device having a marker located outward of the lateral wall part.

FIG. 14 is a top view of a light source device 102 that is provided with a marker 19 outward of the lateral wall part 50. The light source device 102 illustrated in FIG. 14 includes a substrate 10 larger in size than the lid member 60 in the XZ plane. When viewed from above, the marker 19 that identifies the emission positions of the laser beams is provided in the outer region 10D, outward of the lateral wall part 50, of the upper face of the substrate 10. According to this example, when secondarily mounting the light source device on another substrate, for example, the marker 19 can be used as a reference to facilitate the alignment. The shape and the size of the marker 19 are discretionary in this case as well.

Figure 15:
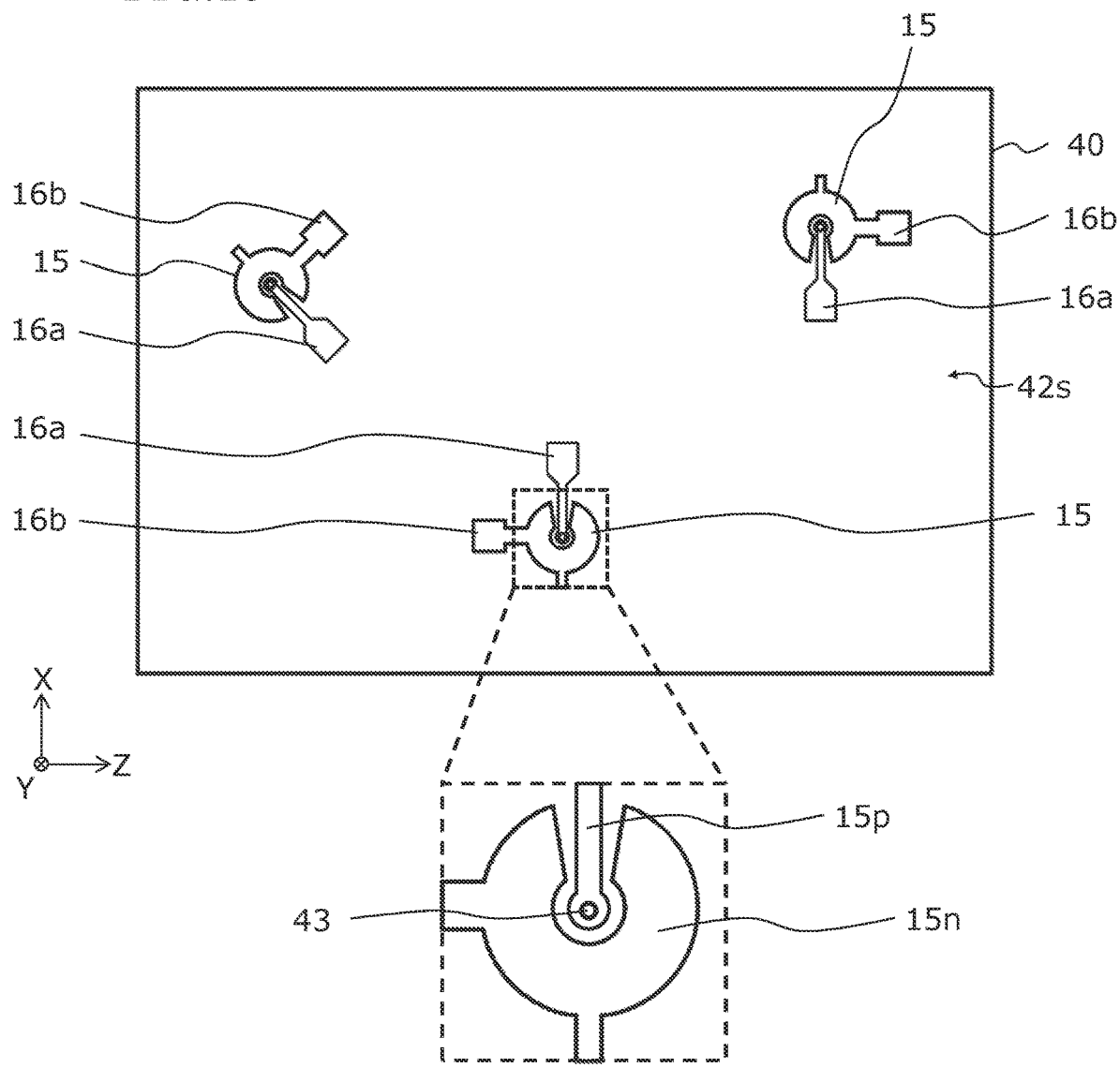
FIG. 15 is a diagram schematically showing an example of a second wiring layer pattern provided on the light incident face of a PLC.
Figure 16:
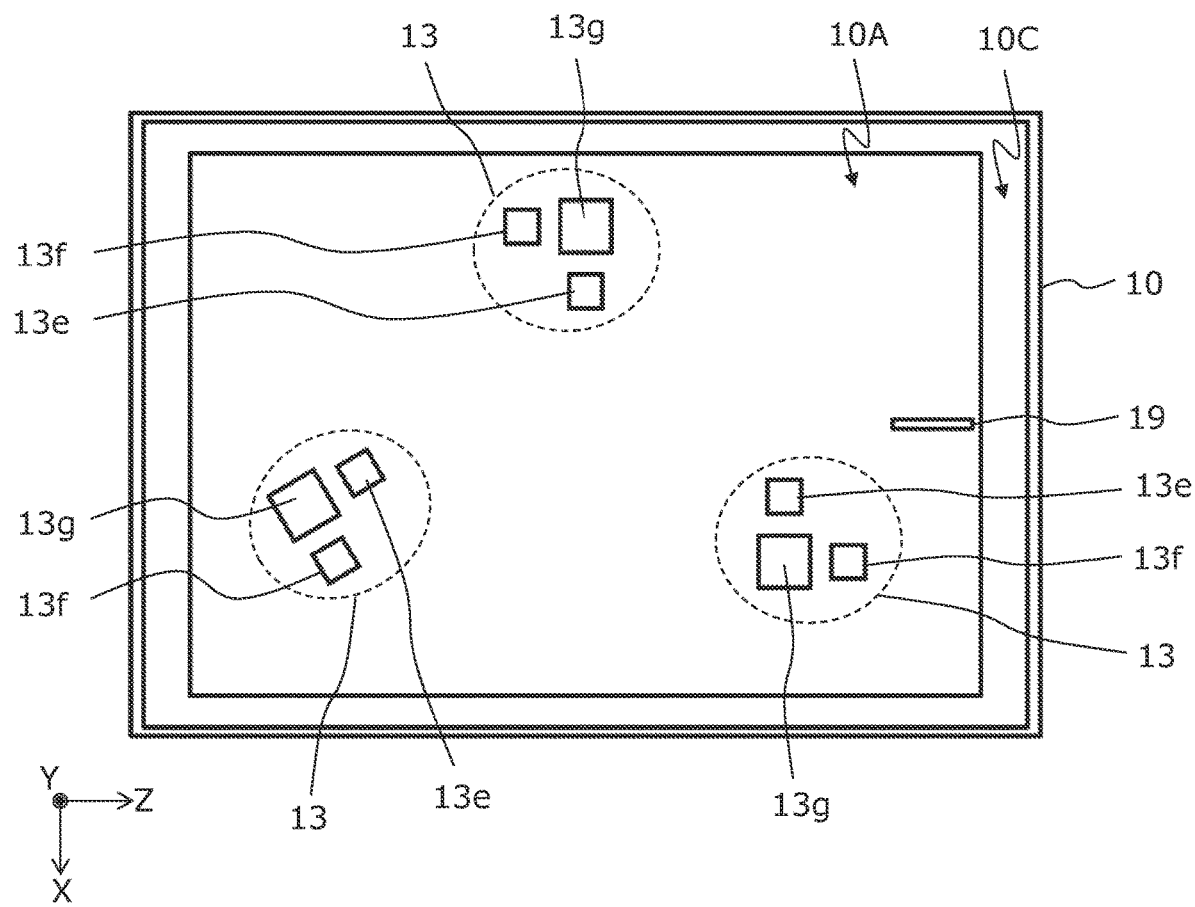
FIG. 16 is a diagram schematically showing an example of a first wiring layer pattern provided on the support face of the substrate.

FIG. 15 is a diagram showing an example of the pattern of the second wiring layer 15 disposed on the light incident face 42s of the PLC 40. FIG. 16 is a diagram showing an example of the pattern of the first wiring layer 13 disposed on the support face 10A of the substrate 10. FIG. 15 and FIG. 16 respectively illustrates the patterns of the second wiring layer 15 and the first wiring layer 13 in the case of disposing each light emitting element 20 on the substrate 10 such that the electrode pair 208 illustrated in FIG. 3B faces the light emission face 42s of the PLC 40. The second wiring layer 15 includes a p-side wiring region 15p to be electrically connected to the p-side electrode 208p of the electrode pair 208, and an n-side wiring region 15n to be electrically connected to the n-side electrode 208n of the electrode pair 208. Similar to the first wiring layer 13 in the case discussed earlier with reference to FIG. 13, the shape of the second wiring layer 15 can be determined in accordance with the shape of the electrode pair 208. The second wiring layer 15 illustrated in FIG. 15 has the shape that corresponds to the electrode pair 208 illustrated in FIG. 3B. However, the shape, the angle (e.g., the direction in which the p-side wiring region 15p extends), and the position of the second wiring layer 15 shown in FIG. 15 are merely exemplary, and can be suitably modified.

The p-side wiring region 15p includes an opening that defines the light incident region 43 at the position on which the light exiting from a light emitting element 20 becomes incident. In the pattern of the second wiring layer 15 illustrated in FIG. 15, the light incident region 43 is positioned in the center of the pattern. However, the position of the light incident region 43 is not limited to the center.

On the light incident face 42s, an electrode pad 16a and an electrode pad 16b are further disposed. The p-side wiring region 15p is electrically connected to the electrode pad 16a, and the n-side wiring region 15n is electrically connected to the electrode pad 16b. In the example shown in FIG. 15, the electrode pad 16b is located in the position resulting from rotating the electrode pad 16a 90° counterclockwise, but the relative position of the electrode pad 16b to the electrode pad 16a is discretionary.

The pattern of the first wiring layer 13 illustrated in FIG. 16 includes three electrode pads 13e, 13f, and 13g. The pattern, however, is merely exemplary, and the shape, the size, and the position of the pattern of the first wiring layer 13 are discretionary. The electrode pad 13e of the substrate 10 will be electrically connected to the electrode pad 16a of the PLC 40 via the support member 70 that has conductivity. The electrode pad 13f of the substrate 10 will be electrically connected to the electrode pad 16b of the PLC 40 via the support member 70 that has conductivity. Such a wiring connection can electrically connect the p-side electrode 208p of the electrode pair 208 of a light emitting element 20 to the p-side wiring region 15p of the second wiring layer 15, the electrode pad 16a, the support member 70, the electrode pad 13e of the substrate 10, and the external connection electrode 11 (see FIG. 2) in that order. The n-side electrode 208n of the electrode pair 208 can be electrically connected to the n-side wiring region 15n of the second wiring layer 15, the electrode pad 16b, the support member 70, the electrode pad 13f of the substrate 10, and the external connection electrode 12 (see FIG. 2) in that order. The electrode pad 13g of the first wiring layer 13 functions as the bonding region that bonds the light emitting element 20 to the support face 10A.

The light source devices according to the present disclosure can be utilized in head-mounted displays, projectors, displays, or lighting fixtures.

What is claimed is:

1. A light source device comprising:
a substrate having a support face;
a plurality of light emitting elements disposed on the support face, the plurality of light emitting elements including a first light emitting element and a second light emitting element, each of which is a vertical-cavity surface-emitting laser element;
a lateral wall part bonded to the support face, the lateral wall part surrounding the plurality of light emitting elements;
a lid member supported by the lateral wall part; and
a planar lightwave circuit having a light incident face that faces the support face and comprising a plurality of optical waveguides configured to guide light that has exited from the respective plurality of light emitting elements and entered the light incident face; wherein:
the planar lightwave circuit is directly or indirectly supported by the plurality of light emitting elements;
the substrate comprises a first wiring layer electrically connected to the first light emitting element and the second light emitting element; and
the plurality of light emitting elements and the planar lightwave circuit are hermetically sealed in a space formed by the substrate, the lateral wall part and the lid member.

2. The light source device according to claim 1, wherein:
the first light emitting element comprises a p-side electrode and an n-side electrode; and
the substrate is electrically connected to and in thermal contact with at least one of the p-side electrode and the n-side electrode.

3. The light source device according to claim 1, further comprising:
a first optical member positioned between the first light emitting element and the planar lightwave circuit and configured to collect first light that has exited from the first light emitting element; and
a second optical member positioned between the second light emitting element and the planar lightwave circuit and configured to collect second light that has exited from the second light emitting element.

4. The light source device according to claim 3, wherein:
the plurality of optical waveguides include:
a first optical waveguide configured to guide the first light from a first light incident region to a first light emission end, and
a second optical waveguide configured to guide the second light from a second light incident region to a second light emission end;
the first optical member is bonded to the first light emitting element and the first light incident region; and
the second optical member is bonded to the second light emitting element and the second light incident region.

5. The light source device according to claim 3, wherein:
when viewed from above in a direction normal to the support face, a center of gravity of the planar lightwave circuit is positioned in a geometric shape formed by virtual lines connecting centers of the plurality of light emitting elements.

6. The light source device according to claim 4, wherein:
the plurality of light emitting elements further include a third light emitting element;
the third light emitting element is a vertical-cavity surface-emitting laser element and is electrically connected to the first wiring layer; and
the plurality of optical waveguides include a third optical waveguide configured to guide third light that has exited from the third light emitting element, from a third light incident region to a third light emission end.

7. The light source device according to claim 6, wherein the first light, the second light, and the third light have different peak wavelengths from one another selected from among blue, green, red, and infrared.

8. The light source device according to claim 6, wherein at least two of the first light, the second light, and the third light have the same peak wavelength.

9. The light source device according to claim 6, wherein when viewed from above in a direction normal to the support face, a center of gravity of the planar lightwave circuit is positioned in a triangle formed by virtual lines connecting a center of the first light emitting element, a center of the second light emitting element, and a center of the third light emitting element.

10. The light source device according to claim 1, further comprising:
a support member bonded to the support face and supporting the planar lightwave circuit; wherein:
when viewed from above in a direction normal to the support face, a center of gravity of the planar lightwave circuit is positioned in a triangle formed by virtual lines connecting a center of the first light emitting element, a center of the second light emitting element, and a center of the support member.

11. The light source device according to claim 10, wherein:
the support member has conductivity and electrically connects at least one of the first light emitting element, the second light emitting element, and the third light emitting element to the first wiring layer.

12. The light source device according to claim 11, wherein:
the planar lightwave circuit comprises, at the light incident face, a second wiring layer electrically connected to the support member;
at least one of the first light emitting element, the second light emitting element, and the third light emitting element has a lower face bonded to the support face, and comprises a p-side electrode and an n-side electrode positioned opposite the lower face, and
the p-side electrode and the n-side electrode are electrically connected to the first wiring layer via the second wiring layer and the support member.

13. The light source device according to claim 4, wherein a distance between centers of the first and second light emission ends is smaller than a distance between centers of the first and second light incident regions.

14. The light source device according to claim 4, wherein:
the first light emitting element has a light emission face that comprises a plurality of emitters each emitting the first light;
the second light emitting element has a light emission face that comprises a plurality of emitters each emitting the second light;
the first optical member includes a first optical array configured to collect the first light exiting from the plurality of emitters of the first light emitting element; and
the second optical member includes a second optical array configured to collect second light exiting from the plurality of emitters of the second light emitting element.

15. The light source device according to claim 14, wherein:
- the first light incident region comprises a plurality of first incident parts;
- the second light incident region comprises a plurality of second incident parts;
- the first light emission end comprises a plurality of first emission parts;
- the second light emission end comprises a plurality of second emission parts;
- the first optical waveguide comprises a plurality of first optical waveguide parts that respectively connect the plurality of first incident parts to the plurality of first emission parts;
- the second optical waveguide comprises a plurality of second optical waveguide parts that respectively connect the plurality of second incident parts to the plurality of second emission parts;
- the first light that has passed through the first optical array and entered the plurality of first incident parts propagates through the respective plurality of first optical waveguide parts and exits the plurality of first emission parts; and
- the second light that has passed through the second optical array and entered the plurality of second incident parts propagates through the respective plurality of second optical waveguide parts and exits the plurality of second emission parts.

16. A light source device comprising:
- a substrate having a support face;
- a plurality of light emitting elements disposed on the support face, the plurality of light emitting elements including a first light emitting element and a second light emitting element, each of which is a vertical-cavity surface-emitting laser element;
- a planar lightwave circuit having a light incident face that faces the support face and comprising a plurality of optical waveguides configured to guide light that has exited from the respective plurality of light emitting elements and entered the light incident face; and
- a support member bonded to the support face; wherein:
- the planar lightwave circuit is directly or indirectly supported by the plurality of light emitting elements, and is supported by the support member;
- the substrate comprises a first wiring layer electrically connected to the first light emitting element and the second light emitting element; and
- when viewed from above in a direction normal to the support face, a center of gravity of the planar lightwave circuit is positioned in a triangle formed by virtual lines connecting a center of the first light emitting element, a center of the second light emitting element, and a center of the support member.

17. The light source device according to claim 16, wherein:
- the support member has conductivity and electrically connects at least one of the first light emitting element, the second light emitting element, and the third light emitting element to the first wiring layer.

18. The light source device according to claim 17, wherein:
- the planar lightwave circuit comprises, at the light incident face, a second wiring layer electrically connected to the support member;
- at least one of the first light emitting element, the second light emitting element, and the third light emitting element has a lower face bonded to the support face, and comprises a p-side electrode and an n-side electrode positioned opposite the lower face, and
- the p-side electrode and the n-side electrode are electrically connected to the first wiring layer via the second wiring layer and the support member.

19. The light source device according to claim 1, wherein:
- each of the plurality of optical waveguides comprises a waveguide core; and
- planar lightwave circuit comprises a substrate, a clad layer located on a surface of the substrate, and the waveguide cores of the plurality of optical waveguides.

20. The light source device according to claim 19, wherein:
- the clad layer comprises a underclad layer located on the surface of the substrate, and an overclad layer; and
- the waveguide cores of the plurality of optical waveguides are located between the underclad layer and the overclad layer.

* * * * *